(12) United States Patent
Nishikawa et al.

(10) Patent No.: US 9,911,748 B2
(45) Date of Patent: Mar. 6, 2018

(54) EPITAXIAL SOURCE REGION FOR UNIFORM THRESHOLD VOLTAGE OF VERTICAL TRANSISTORS IN 3D MEMORY DEVICES

(71) Applicant: SANDISK TECHNOLOGIES INC., Plano, TX (US)

(72) Inventors: Masatoshi Nishikawa, Yokkaichi (JP); Kiyohiko Sakakibara, Yokkaichi (JP); Hiroyuki Ogawa, Yokkaichi (JP); Shuji Minagawa, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 36 days.

(21) Appl. No.: 14/867,351

(22) Filed: Sep. 28, 2015

(65) Prior Publication Data

US 2017/0092654 A1    Mar. 30, 2017

(51) Int. Cl.
*H01L 29/76* (2006.01)
*H01L 27/11582* (2017.01)
(Continued)

(52) U.S. Cl.
CPC .. *H01L 27/11582* (2013.01); *H01L 21/02532* (2013.01); *H01L 21/02598* (2013.01);
(Continued)

(58) Field of Classification Search
CPC ......... H01L 27/11582; H01L 27/11556; H01L 27/1157; H01L 21/02532; H01L 21/02598; H01L 29/04; H01L 29/0847
See application file for complete search history.

(56) References Cited

U.S. PATENT DOCUMENTS 5,915,167 A    6/1999  Leedy
2011/0151667 A1    6/2011  Hwang et al.
(Continued)

FOREIGN PATENT DOCUMENTS

JP    2014-057067 A    3/2014

OTHER PUBLICATIONS

The International Search Report and Written Opinion of the International Searching Authority for International pplication No. PCT/US2016/036177, dated Sep. 26, 2016, 10 pages.
(Continued)

*Primary Examiner* — Matthew Gordon
(74) *Attorney, Agent, or Firm* — The Marbury Law Group PLLC

(57) ABSTRACT

An alternating stack of insulating layers and sacrificial material layers are formed over a substrate. Memory stack structures are formed through the alternating stack. A backside trench is formed and the sacrificial material layers are replaced with electrically conductive layers. After formation of an insulating spacer in the trench, an epitaxial pedestal structure is grown from a semiconductor portion underlying the backside trench. A source region is formed by introducing dopants into the epitaxial pedestal structure and an underlying semiconductor portion during and/or after epitaxial growth. Alternatively, the backside trench can be formed concurrently with formation of memory openings. An epitaxial pedestal structure can be formed concurrently with formation of epitaxial channel portions at the bottom of each memory opening. After formation and subsequent removal of a dummy trench fill structure in the backside trench, a source region is formed by introducing dopants into the epitaxial pedestal structure.

19 Claims, 32 Drawing Sheets

(51) Int. Cl.
  *H01L 27/11556* (2017.01)
  *H01L 29/08* (2006.01)
  *H01L 29/417* (2006.01)
  *H01L 29/16* (2006.01)
  *H01L 29/04* (2006.01)
  *H01L 29/788* (2006.01)
  *H01L 21/02* (2006.01)
  *H01L 21/265* (2006.01)
  *H01L 29/66* (2006.01)
  *H01L 27/1157* (2017.01)

(52) U.S. Cl.
  CPC .. *H01L 21/02636* (2013.01); *H01L 21/26513* (2013.01); *H01L 27/1157* (2013.01); *H01L 27/11556* (2013.01); *H01L 29/04* (2013.01); *H01L 29/0847* (2013.01); *H01L 29/16* (2013.01); *H01L 29/41741* (2013.01); *H01L 29/66545* (2013.01); *H01L 29/7883* (2013.01)

(56) References Cited

U.S. PATENT DOCUMENTS

| | | | |
|---|---|---|---|
| 2013/0126957 A1 | 5/2013 | Higashitani et al. | |
| 2014/0264548 A1* | 9/2014 | Lee .................... | H01L 27/11582 257/324 |
| 2015/0194435 A1* | 7/2015 | Lee .................... | H01L 27/11575 257/329 |
| 2016/0233224 A1* | 8/2016 | Rhie ................. | H01L 27/11582 |

OTHER PUBLICATIONS

Office Communication Concerning Corresponding U.S. Appl. No. 14/501,539, filed Sep. 30, 2014, (19 pages).
Endoh et al., "Novel Ultra High Density Memory with a Stacked-Surrounding Gate Transistor (S-SGT) Structured Cell," IEDM Proc. (2001) 33-36.
U.S. Appl. No. 14/133,979, filed Dec. 19, 2013, SanDisk Technologies Inc.
U.S. Appl. No. 14/225,116, filed Mar. 25, 2014, SanDisk Technologies Inc.
U.S. Appl. No. 14/225,176, filed Mar. 25, 2014, SanDisk Technologies Inc.
U.S. Appl. No. 14/468,743, filed Aug. 26, 2014, SanDisk Technologies Inc.
U.S. Appl. No. 14/501,539, filed Sep. 30, 2014, SanDisk Technologies Inc.
U.S. Appl. No. 14/491,315, filed Sep. 19, 2014, SanDisk Technologies Inc.
U.S. Appl. No. 14/491,026, filed Sep. 19, 2014, SanDisk Technologies Inc.
U.S. Appl. No. 14/462,209, filed Aug. 14, 2014, SanDisk Technologies Inc.
U.S. Appl. No. 14/540,479, filed Nov. 13, 2014, SanDisk Technologies Inc.
U.S. Appl. No. 14/602,491, filed Jan. 22, 2015, SanDisk Technologies Inc.
U.S. Appl. No. 14/703,367, filed May 4, 2015, SanDisk Technologies Inc.

* cited by examiner

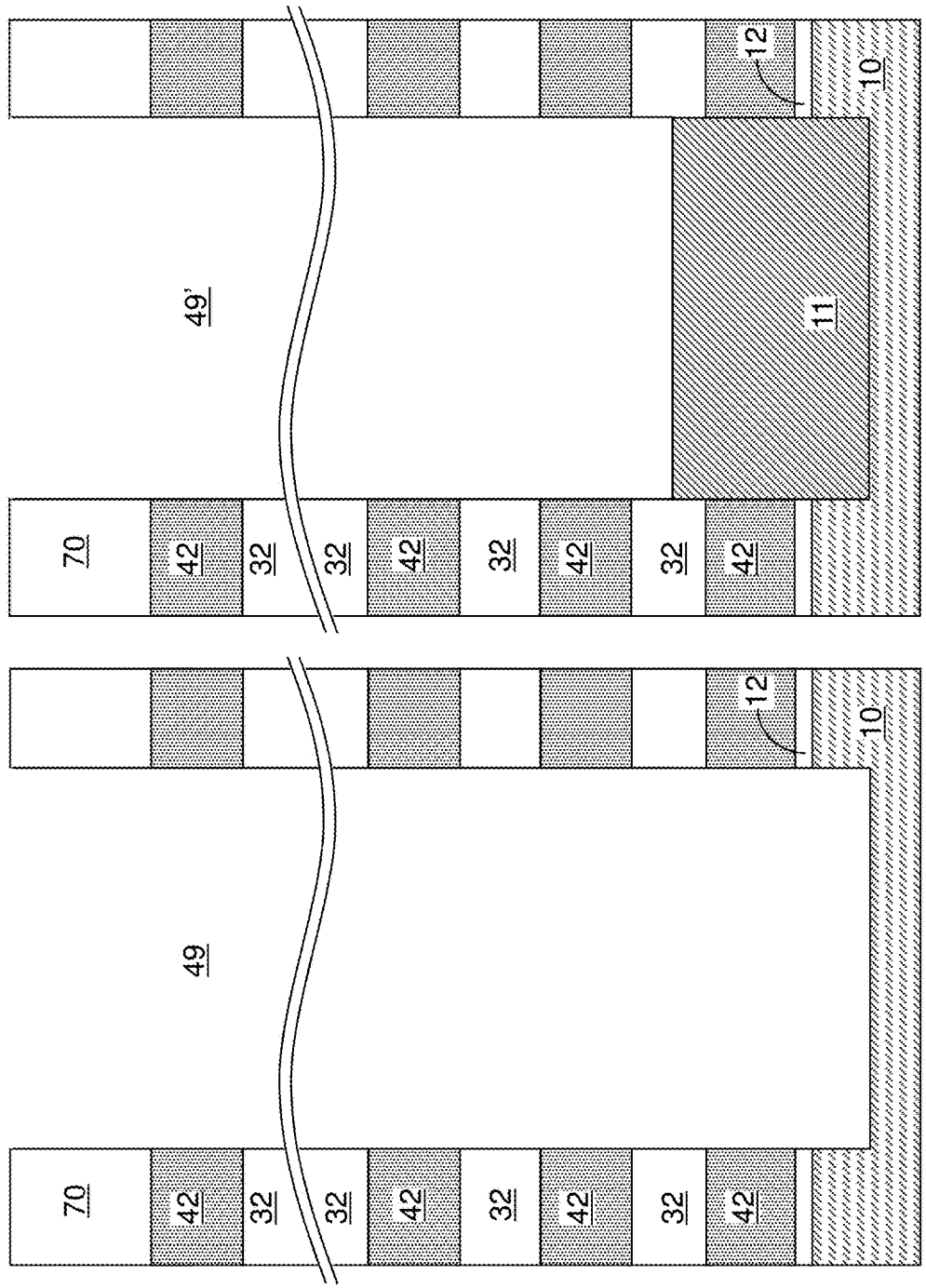

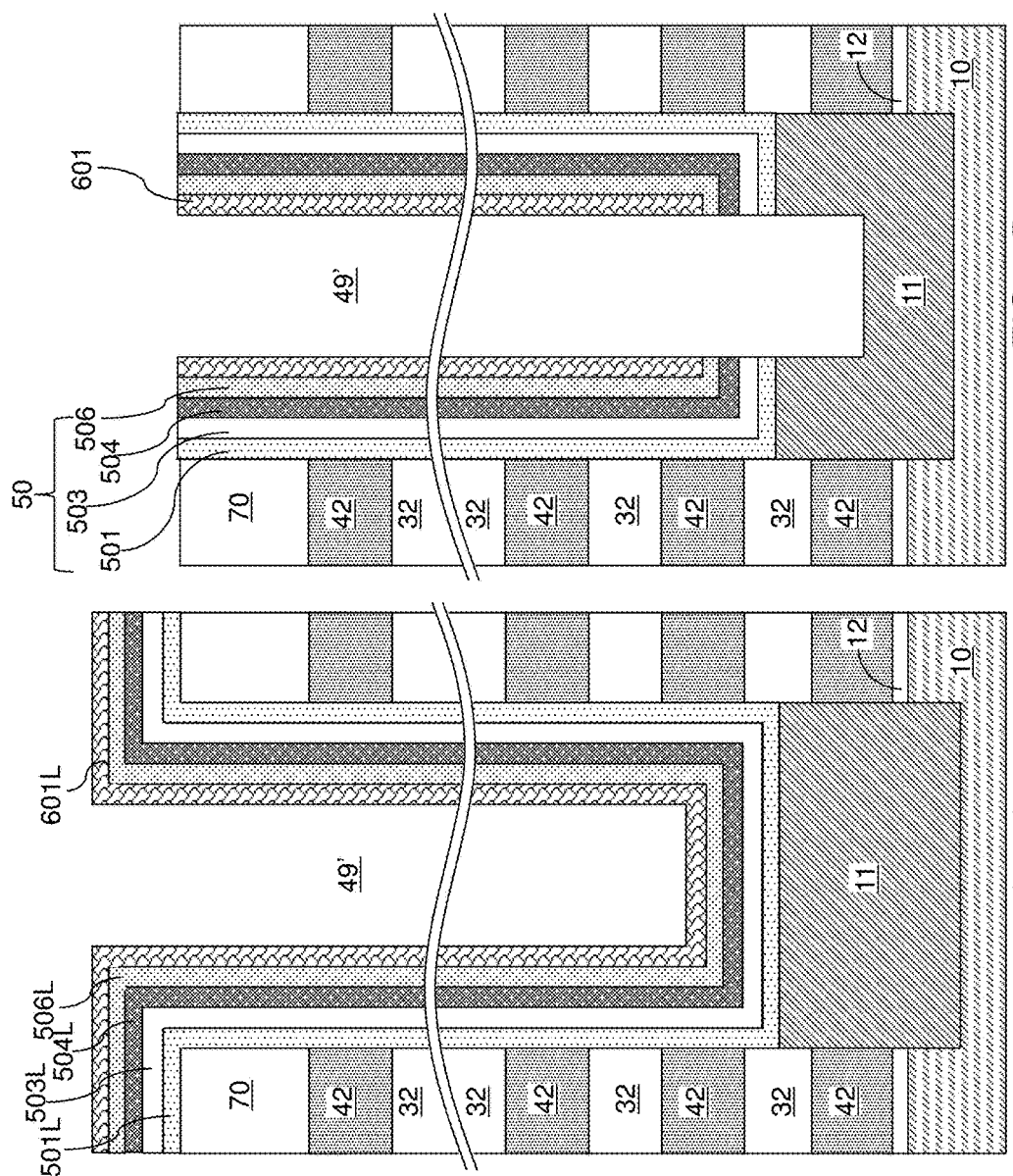

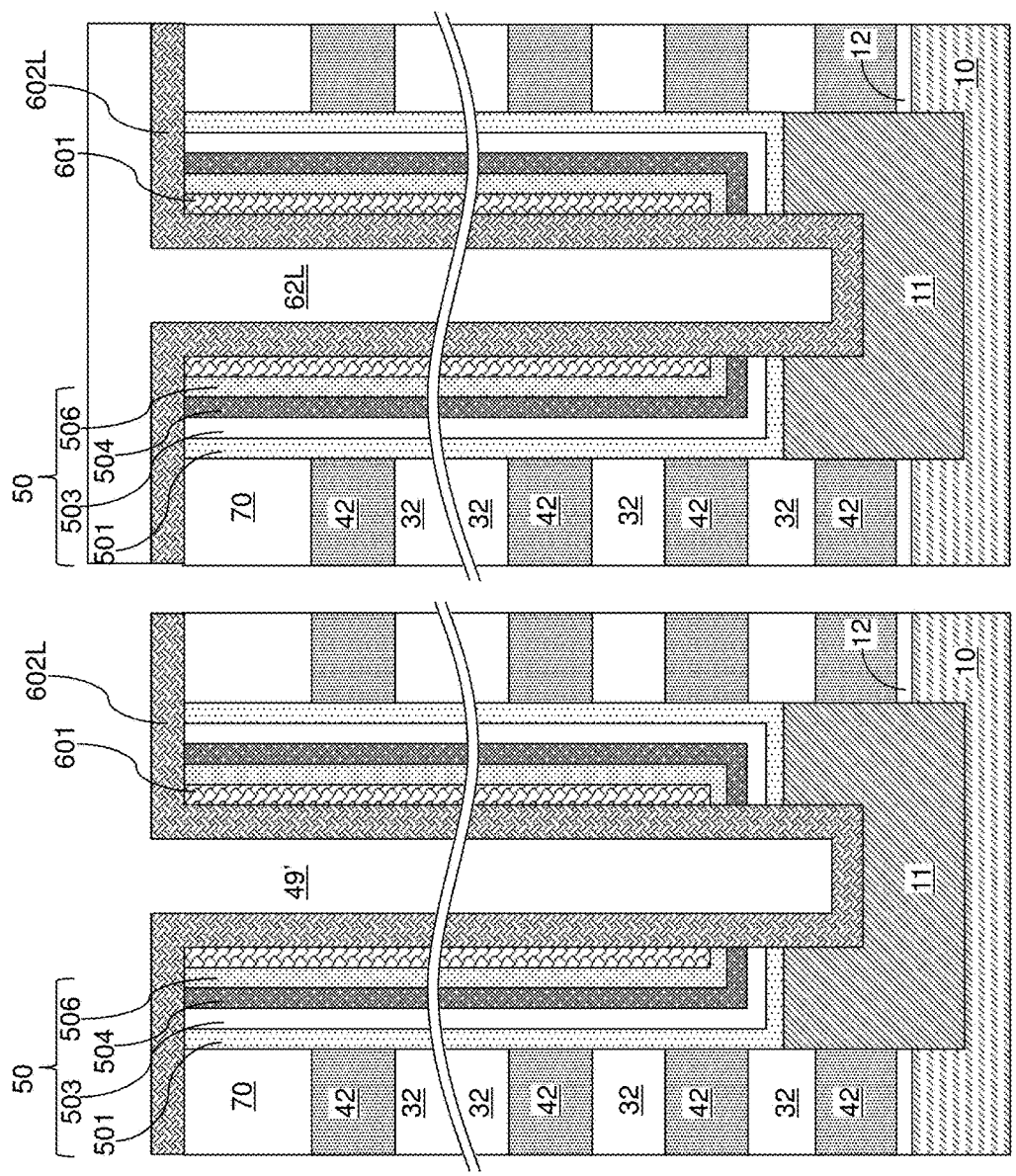

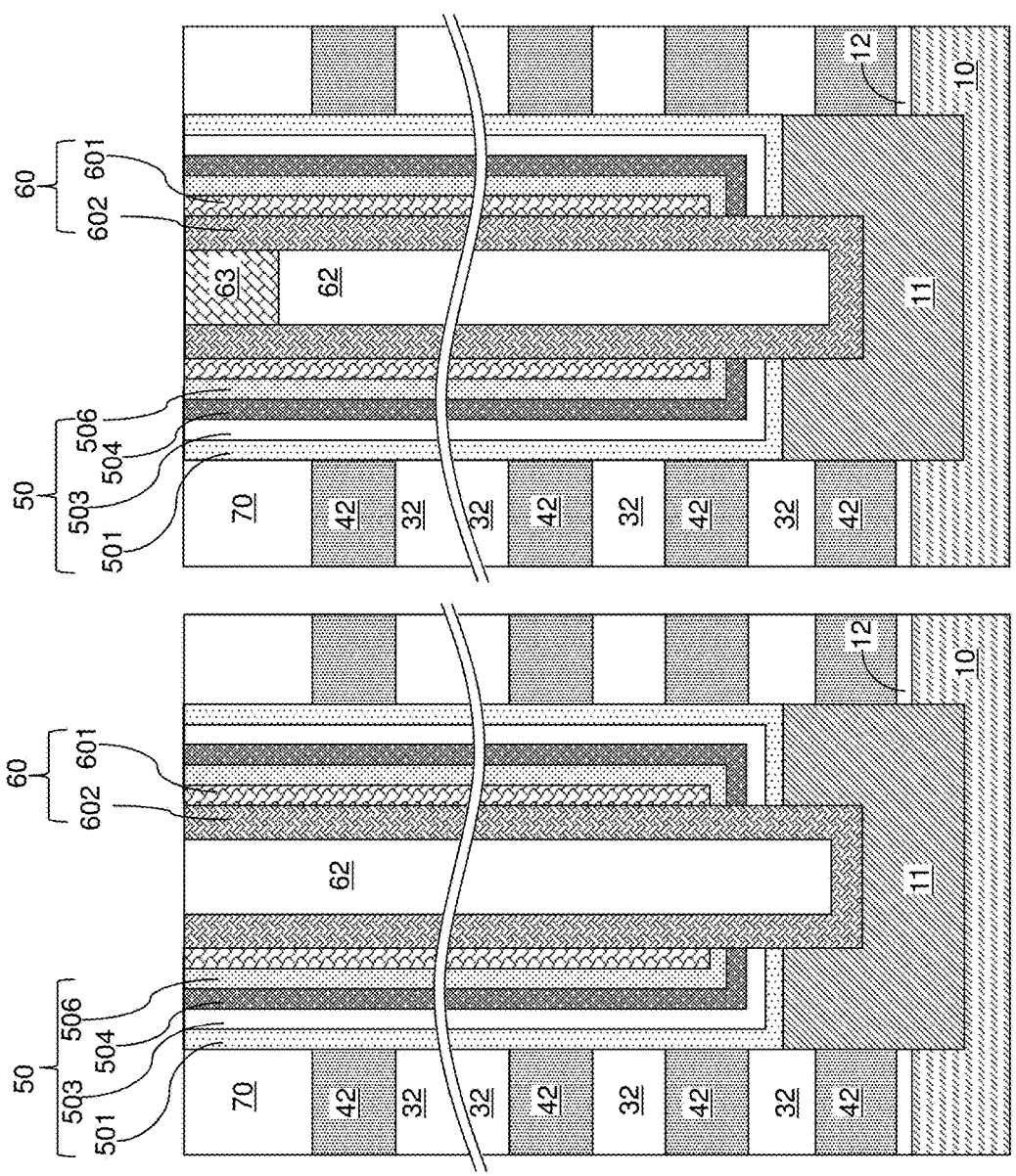

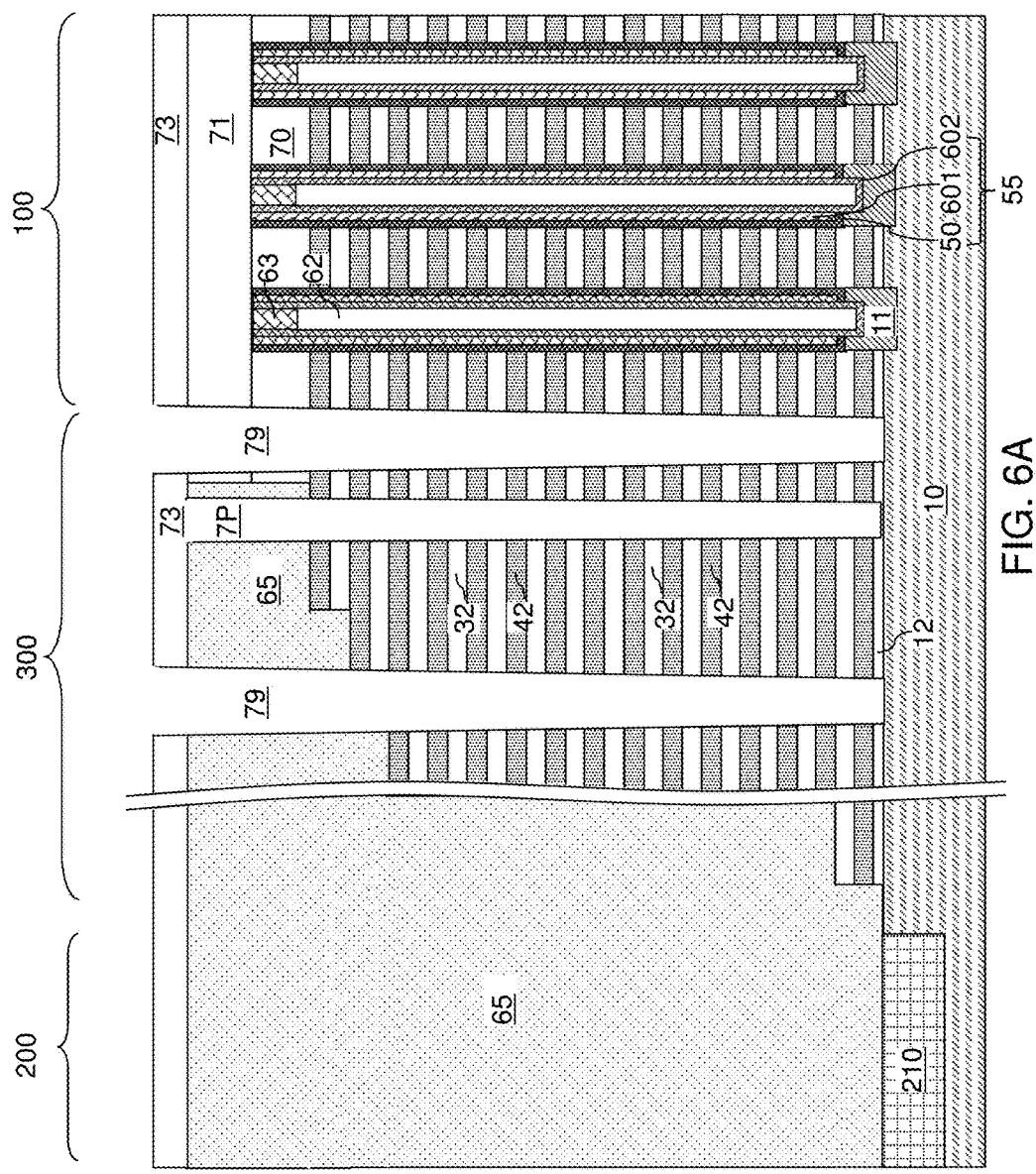

EPITAXIAL SOURCE REGION FOR UNIFORM THRESHOLD VOLTAGE OF VERTICAL TRANSISTORS IN 3D MEMORY DEVICES

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises an alternating stack of insulating layers and electrically conductive layers and located over a substrate; memory stack structures extending through the alternating stack; and a source region comprising a substrate source portion located in the substrate and an epitaxial pedestal source portion overlying, and in epitaxial alignment, with the substrate source portion.

According to another aspect of the present disclosure, a method of manufacturing a three-dimensional memory device is provided. An alternating stack comprising insulating layers and sacrificial material layers is formed over a single crystalline semiconductor material portion of substrate. Memory stack structures extending through the alternating stack are formed. A backside trench is formed through the alternating stack. A top surface of the single crystalline semiconductor material portion is physically exposed at a bottom of the backside trench. An epitaxial pedestal structure is formed on the top surface of, and in epitaxial alignment with, the single crystalline semiconductor material portion. A source region is formed by doping the epitaxial pedestal structure and a surface region of the single crystalline semiconductor material portion that underlies the epitaxial pedestal structure. The step of doping occurs during the step of forming the epitaxial pedestal structure, after the step of forming the epitaxial pedestal structure, or both during and after the step of forming the epitaxial pedestal structure.

BRIEF DESCRIPTION OF THE DRAWINGS

FIGS. 2A-2H are sequential vertical cross-sectional views of a memory opening within the first exemplary structure during various processing steps employed to form a memory stack structure according to the first embodiment of the present disclosure.

FIG. 6A is a vertical cross-sectional view of the first exemplary structure after formation of backside trenches according to the first embodiment of the present disclosure.

DETAILED DESCRIPTION

Figure 1:
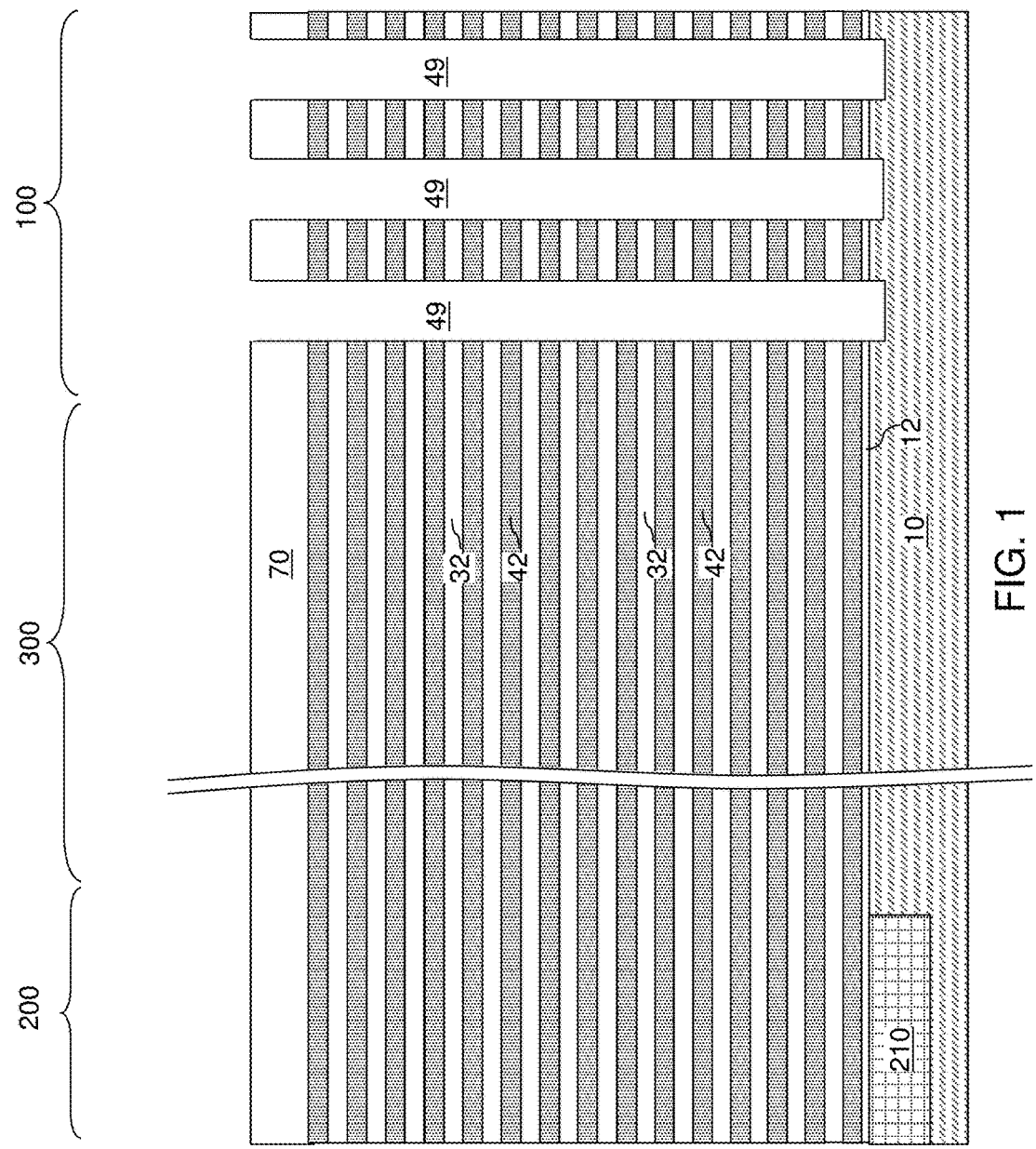
FIG. 1 is a vertical cross-sectional view of a first exemplary structure after formation of an alternating stack of insulating layers and sacrificial material layers and memory openings extending through the alternating stack according to a first embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor. A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to an embodiment of the present disclosure is illustrated, which can be employed, for example, to fabricate a device structure containing vertical NAND memory devices. The exemplary structure includes a substrate, which can be a semiconductor substrate (e.g., a single crystalline silicon wafer). The substrate can include a substrate semiconductor layer 10. The substrate semiconductor layer 10 may be an upper portion of the substrate (e.g., top portion of a silicon wafer) or it may be a semiconductor material layer located over the top of substrate (e.g., over the top surface of the silicon wafer), and can include at least one elemental semiconductor material (e.g., silicon, such as single crystalline silicon), at least one III-V compound semiconductor material, at least one II-VI compound semiconductor material, at least one organic semiconductor material, or other semiconductor materials known in the art.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. All measurements for electrical conductivities are made at the standard condition. The substrate semiconductor layer 10 can include at least one doped well (not expressly shown) having a substantially uniform dopant concentration therein.

The exemplary structure can have multiple regions for building different types of devices. Such areas can include, for example, a device region 100, a contact region 300, and a peripheral device region 200. In one embodiment, the substrate semiconductor layer 10 can include at least one a doped well in the device region 100. As used herein, a "doped well" refers to a portion of a semiconductor material having a doping of a same conductivity type (which can be p-type or n-type) and a substantially same level of dopant concentration throughout. The doped well can be the same as the substrate semiconductor layer 10 or can be a portion of the substrate semiconductor layer 10. The conductivity type of the doped well is herein referred to as a first conductivity type, which can be p-type or n-type. The dopant concentration level of the doped well is herein referred to as a first dopant concentration level. In one embodiment, the first dopant concentration level can be in a range from $1.0 \times 10^{15}/cm^3$ to $1.0 \times 10^{18}/cm^3$, although lesser and greater dopant concentration levels can also be employed. As used herein, a dopant concentration level refers to average dopant concentration for a given region.

Peripheral devices 210 can be formed in, or on, a portion of the substrate semiconductor layer 10 located within the peripheral device region 200. The peripheral devices can include various devices employed to operate the memory devices to be formed in the device region 100, and can include, for example, driver circuits for the various components of the memory devices. The peripheral devices 210 can include, for example, field effect transistors and/or passive components such as resistors, capacitors, inductors, diodes, etc.

Optionally, a gate dielectric layer 12 can be formed above the substrate semiconductor layer 10. The gate dielectric layer 12 can be employed as the gate dielectric for a first source select gate electrode. The gate dielectric layer 12 can include, for example, silicon oxide and/or a dielectric metal oxide (such as $HfO_2$, $ZrO_2$, $LaO_2$, etc.). The thickness of the gate dielectric layer 12 can be in a range from 3 nm to 30 nm, although lesser and greater thicknesses can also be employed.

An alternating stack of first material layers (which can be insulating layers 32) and second material layers (which are referred to spacer material layers) is formed over the top surface of the substrate, which can be, for example, on the top surface of the gate dielectric layer 12. As used herein, a "material layer" refers to a layer including a material throughout the entirety thereof. As used herein, a "spacer material layer" refers to a material layer that is located between two other material layers, i.e., between an overlying material layer and an underlying material layer. The spacer material layers can be formed as electrically conductive layers, or can be replaced with electrically conductive layers in a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer 42. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the top surface of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

A lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form first memory openings 49. In other words, the transfer of the pattern in the patterned lithographic material stack through the alternating stack (32, 42) forms the first memory openings that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the gate dielectric layer 12 may be used as an etch stop layer between the alternating stack (32, 42) and the substrate. The sidewalls of the first memory openings can be substantially vertical, or can be tapered. The patterned lithographic material stack can be subsequently removed, for example, by ashing.

A memory stack structure can be formed in each of the memory opening. FIGS. 2A-2H illustrate sequential vertical cross-sectional views of a memory opening during formation of an exemplary memory stack structure. Formation of the exemplary memory stack structure can be performed within each of the memory openings 49 in the exemplary structure illustrated in FIG. 1.

Referring to FIG. 2A, a memory opening 49 is illustrated. The memory opening 49 extends through the insulating cap layer 70, the alternating stack (32, 42), and the gate dielectric layer 12, and optionally into an upper portion of the substrate semiconductor layer 10. The recess depth of the bottom surface of each memory opening 49 with respect to the top surface of the substrate semiconductor layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 2B, an epitaxial channel portion 11 can be optionally formed at the bottom of each memory opening 49 by selective epitaxy of a semiconductor material. During the selective epitaxy process, a reactant gas and an etchant gas can be simultaneously or alternatively flowed into a process chamber. Semiconductor surfaces and dielectric surfaces of the exemplary structure provide different nucleation rates for the semiconductor material. By setting the etch rate (determined by the flow of the etchant gas) of the semiconductor material greater than the nucleation rate of the semiconductor material on the dielectric surfaces and less than the nucleation rate of the semiconductor material on the semiconductor surfaces, the semiconductor material can grow from the physically exposed semiconductor surfaces (i.e., from the physically exposed surfaces of the substrate semiconductor layer 10 at the bottom of each memory opening 49). Each portion of the deposited semiconductor material constitutes an epitaxial channel portion 11, which comprises a single crystalline semiconductor material (e.g., single crystalline silicon) in epitaxial alignment with the single crystalline semiconductor material (e.g., single crystalline silicon) of the substrate semiconductor layer 10. Thus, epitaxial channel portions 11 are formed at a bottom of each memory opening 49 and directly on a single crystalline semiconductor surface of the substrate semiconductor layer 10, which is an uppermost portion of the substrate. Each epitaxial channel portion 11 functions as a portion of a channel of a vertical field effect transistor. The top surface of the epitaxial channel portion 11 can be between a pair of sacrificial material layers 42. In other words, a periphery of each epitaxial channel portion 11 can be in physical contact with a sidewall of an insulating layer 32. A cavity 49' is present over an epitaxial channel portion 11 in each memory opening 49.

Referring to FIG. 2C, a series of layers including at least one blocking dielectric layer (501L, 503L), a continuous memory material layer 504, a tunneling dielectric layer 506L, and an optional first semiconductor channel layer 601L can be sequentially deposited in the memory openings 49. The at least one blocking dielectric layer (501L, 503L) can include, for example, a first blocking dielectric layer 501L and a second blocking dielectric layer 503L.

In an illustrative example, the first blocking dielectric layer 501L can be deposited on the sidewalls of each memory opening 49 by a conformal deposition method. The first blocking dielectric layer 501L includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer 501L can be deposited, for example, by chemical vapor deposition (CVD), atomic layer deposition (ALD), pulsed laser deposition (PLD), liquid source misted chemical deposition, or a combination thereof. The thickness of the first blocking dielectric layer 501L can be in a range from 1 nm to 20 nm, although lesser and greater thicknesses can also be employed. The first blocking dielectric layer 501L can subsequently function as a dielectric material portion that blocks leakage of stored electrical charges to control gate electrodes. In one embodiment, the first blocking dielectric layer 501L includes aluminum oxide.

The second blocking dielectric layer 503L can be formed on the first blocking dielectric layer 501L. The second blocking dielectric layer 503L can include a dielectric material that is different from the dielectric material of the first blocking dielectric layer 501L. In one embodiment, the second blocking dielectric layer 503L can include silicon oxide, a dielectric metal oxide having a different composition than the first blocking dielectric layer 501L, silicon oxynitride, silicon nitride, or a combination thereof. In one embodiment, the second blocking dielectric layer 503L can include silicon oxide. The second blocking dielectric layer 503L can be formed by a conformal deposition method such as low pressure chemical vapor deposition, atomic layer deposition, or a combination thereof. The thickness of the second blocking dielectric layer 503L can be in a range from 1 nm to 20 nm, although lesser and greater thicknesses can also be employed. Alternatively, the first blocking dielectric layer 501L and/or the second blocking dielectric layer 503L can be omitted, and a blocking dielectric layer can be formed after formation of backside recesses on surfaces of memory films to be subsequently formed.

The continuous memory material layer 504, the tunneling dielectric layer 506L, and the optional first semiconductor channel layer 601L can be sequentially formed. In one embodiment, the continuous memory material layer 504 can be a charge trapping material including a dielectric charge trapping material, which can be, for example, silicon nitride. Alternatively, the continuous memory material layer 504 can include a conductive material such as doped polysilicon or a metallic material that is patterned into multiple electrically isolated portions (e.g., floating gates), for example, by being formed within lateral recesses into sacrificial material layers 42. In one embodiment, the continuous memory material layer 504 includes a silicon nitride layer.

The continuous memory material layer 504 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the continuous memory material layer 504 may comprise an insulating charge trapping material, such as one or more silicon nitride segments. Alternatively, the continuous memory material layer 504 may comprise conductive nanoparticles such as metal nanoparticles, which can be, for example, ruthenium nanoparticles. The continuous memory material layer 504 can be formed, for example, by chemical vapor deposition (CVD), atomic layer deposition (ALD), physical vapor deposition (PVD), or any suitable deposition technique for storing electrical charges therein. The thickness of the continuous memory material layer 504 can be in a range from 2 nm to 20 nm, although lesser and greater thicknesses can also be employed.

The tunneling dielectric layer 506L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506L can include a stack of a first silicon oxide layer, a silicon oxynitride layer, and a second silicon oxide layer, which is commonly known as an ONO stack. In one embodiment, the tunneling dielectric layer 506L can include a silicon oxide layer that is substantially free of carbon or a silicon oxynitride layer that is substantially free of carbon. The thickness of the tunneling dielectric layer 506L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (501L, 503L, 504L, 506L, 601L).

Referring to FIG. 2D, the optional first semiconductor channel layer 601L, the tunneling dielectric layer 506L, the continuous memory material layer 504, the at least one blocking dielectric layer (501L, 503L) are sequentially anisotropically etched employing at least one anisotropic etch process. The portions of the first semiconductor channel layer 601L, the tunneling dielectric layer 506L, the continuous memory material layer 504, and the at least one blocking dielectric layer (501L, 503L) located above the top surface of the insulating cap layer 70 can be removed by the at least one anisotropic etch process. Further, the horizontal portions of the first semiconductor channel layer 601L, the tunneling dielectric layer 506L, the continuous memory material layer 504, and the at least one blocking dielectric layer (501L, 503L) at a bottom of each cavity 49' can be removed to form openings in remaining portions thereof. Each of the first semiconductor channel layer 601L, the tunneling dielectric layer 506L, the continuous memory material layer 504, and the at least one blocking dielectric layer (501L, 503L) can be etched by anisotropic etch process.

Each remaining portion of the first semiconductor channel layer 601L constitutes a first semiconductor channel portion 601. Each remaining portion of the tunneling dielectric layer 506L constitutes a tunneling dielectric 506. Each remaining portion of the continuous memory material layer 504 is herein referred to as a memory material layer 504. The memory material layer 504 can comprise a charge trapping material or a floating gate material. In one embodiment, each memory material layer 504 can include a vertical stack of charge storage regions that store electrical charges upon programming. In one embodiment, the memory material layer 504 can be a charge storage layer in which each portion adjacent to the sacrificial material layers 42 constitutes a charge storage region. Each remaining portion of the second blocking dielectric layer 503L is herein referred to as a second blocking dielectric 503. Each remaining portion of the first blocking dielectric layer 501L is herein referred to as a first blocking dielectric 501.

A surface of the epitaxial channel portion 11 (or a surface of the substrate semiconductor layer 10 in case the epitaxial channel portions 11 are not employed) can be physically exposed underneath the opening through the first semiconductor channel portion 601, the tunneling dielectric 506, the memory material layer 504, and the at least one blocking dielectric (501, 503). Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the substrate semiconductor layer 10 in case epitaxial channel portions 11 are not employed) by a recess distance. A tunneling dielectric 506 is located over the memory material layer 504. A set of at least one blocking dielectric (501, 503), a memory material layer 504, and a tunneling dielectric 506 in a memory opening 49 constitutes a memory film 50, which includes a plurality of charge storage regions (as embodied as the memory material layer 504) that are insulated from surrounding materials by the at least one blocking dielectric (501, 503) and the tunneling dielectric 506.

In one embodiment, the first semiconductor channel portion 601, the tunneling dielectric 506, the memory material layer 504, the second blocking dielectric 503, and the first blocking dielectric 501 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 2E, a second semiconductor channel layer 602L can be deposited directly on the semiconductor surface of the epitaxial channel portion 11 or the substrate semiconductor layer 10 if portion 11 is omitted, and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 2F, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 2G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 506 is embedded within a memory material layer 504, and laterally surrounds a portion of the semiconductor channel 60. Each adjoining set of a first blocking dielectric 501, a second blocking dielectric 503, a memory material layer 504, and a tunneling dielectric 506 collectively constitute a memory film 50, which can store electrical charges with a macroscopic retention time. In some embodiments, a first blocking dielectric 501 and/or a second blocking dielectric 503 may not be present in the memory film 50 at this step, and a blocking dielectric may be subsequently formed after formation of backside recesses. As used herein, a macroscopic retention time refers to a retention time suitable for operation of a memory device as a permanent memory device such as a retention time in excess of 24 hours.

Referring to FIG. 2H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Figure 3:
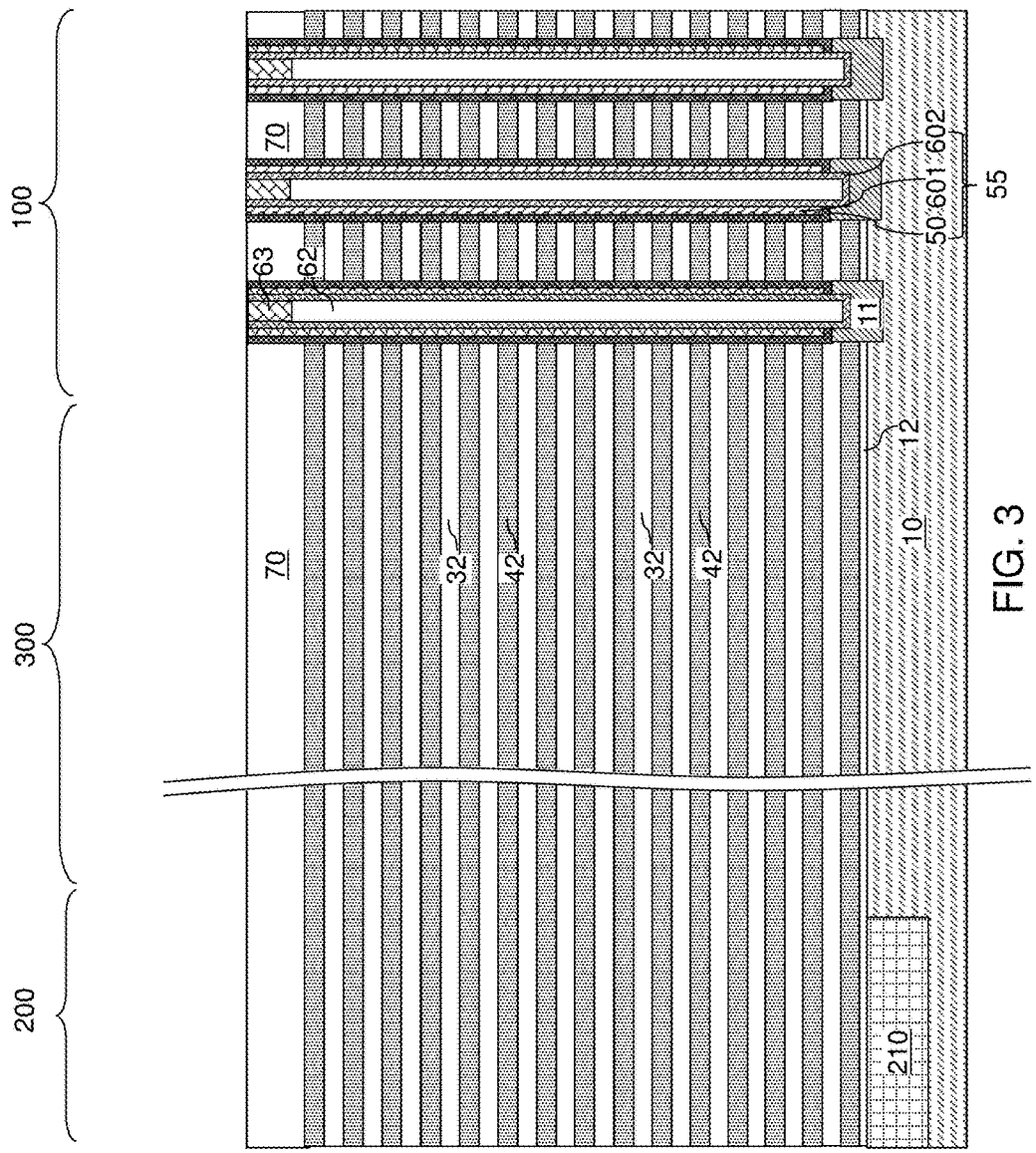
FIG. 3 is a vertical cross-sectional view of the first exemplary structure after formation of memory stack structures according to the first embodiment of the present disclosure.

The exemplary memory stack structure 55 can be embedded into the exemplary structure illustrated in FIG. 1. FIG. 3 illustrates the exemplary structure that incorporates multiple instances of the exemplary memory stack structure of FIG. 2H. The memory stack structures 55 are formed over, and directly on, respective epitaxial channel portions. Each exemplary memory stack structure 55 includes a semiconductor channel (601, 602); a tunneling dielectric layer 506 laterally surrounding the semiconductor channel (601, 602); and a vertical stack of charge storage regions laterally surrounding the tunneling dielectric layer 506 (as embodied as a memory material layer 504). The exemplary structure includes a semiconductor device, which comprises a stack (32, 42) including an alternating plurality of material layers (e.g., the sacrificial material layers 42) and insulating layers 32 located over a semiconductor substrate (e.g., over the substrate semiconductor layer 10), and a memory opening extending through the stack (32, 42). The semiconductor device further comprises a first blocking dielectric 501 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures including a polycrystalline semiconductor channel.

Figure 4:
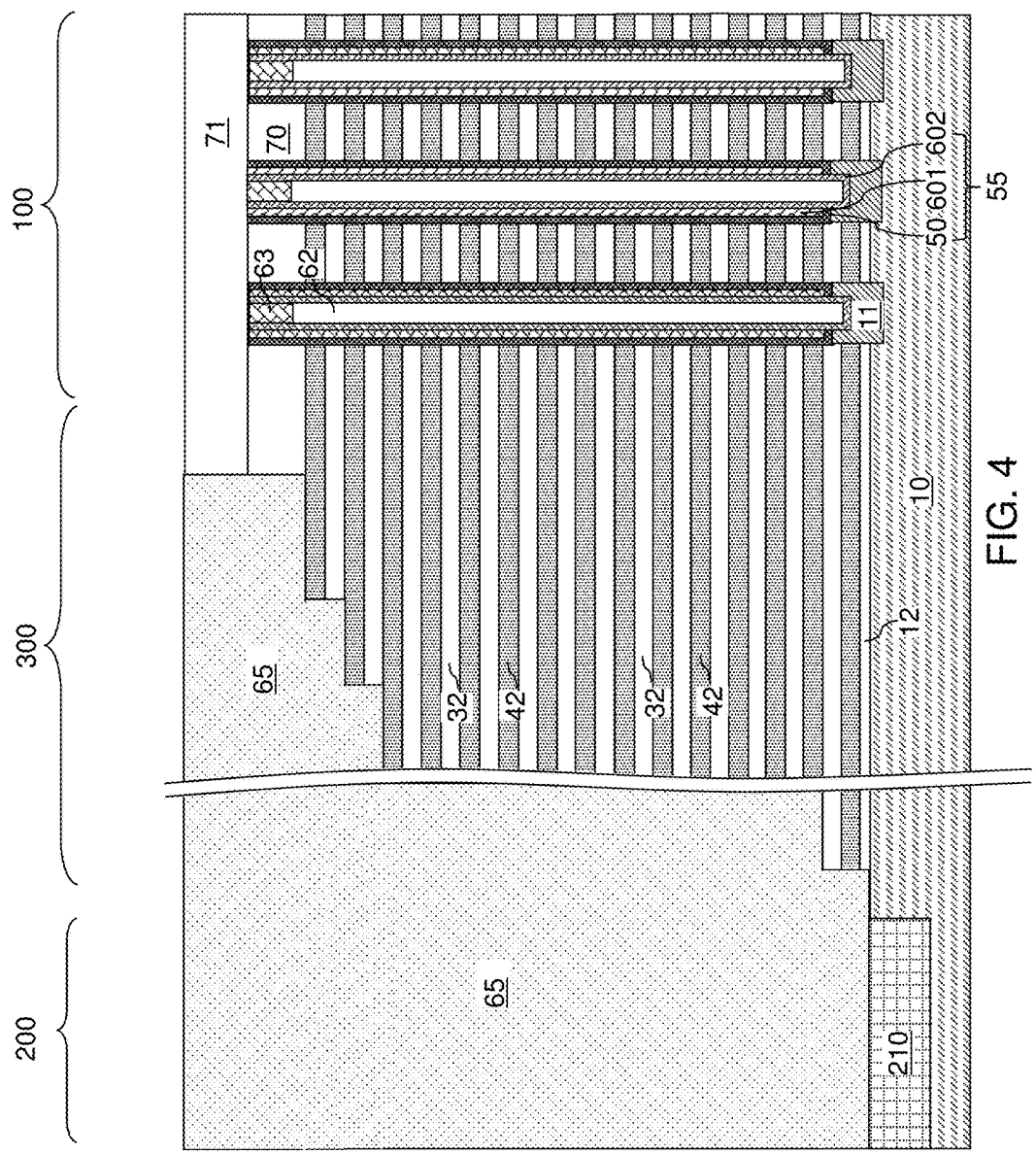
FIG. 4 is a vertical cross-sectional view of the first exemplary structure after formation of a set of stepped surfaces and a retro-stepped dielectric material portion according to the first embodiment of the present disclosure.

Referring to FIG. 4, an optional first contact level dielectric layer 71 can be formed over the substrate semiconductor layer 10. As an optional structure, the first contact level dielectric layer 71 may, or may not, be formed. In case the first contact level dielectric layer 71 is formed, the first contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric layer 71 can be formed over a horizontal plane including the top surface of the insulating cap layer 70 and the top surfaces of the drain regions 63. The first contact level dielectric layer 71 can be deposited by chemical vapor deposition, atomic layer deposition (ALD), spin-coating, or a combination thereof. The thickness of the first contact level dielectric layer 71 can be in a range from 10 nm to 300 nm, although lesser and greater thicknesses can also be employed.

In one embodiment, the first contact level dielectric layer 71 can be formed as a dielectric material layer having a uniform thickness throughout. The first contact level dielectric layer 71 may be formed as a single dielectric material layer, or can be formed as a stack of a plurality of dielectric material layers. Alternatively, formation of the first contact level dielectric layer 71 may be merged with formation of at least one line level dielectric layer (not shown). While the present disclosure is described employing an embodiment in which the first contact level dielectric layer 71 is a structure separate from an optional second contact level dielectric layer or at least one line level dielectric layer to be subsequently deposited, embodiments in which the first contact level dielectric layer 71 and at least one line level dielectric layer are formed at a same processing step, and/or as a same material layer, are expressly contemplated herein.

In one embodiment, the first contact level dielectric layer 71, the insulating cap layer 70, and the alternating stack (32, 42) can be removed from the peripheral device region 200, for example, by a masked etch process. In addition, a stepped cavity can be formed within the contact region 300 by patterning a portion of the alternating stack (32, 42). As used herein, a "stepped cavity" refers to a cavity having stepped surfaces. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "step" refers to a vertical shift in the height of a set of adjoined surfaces.

The stepped cavity can have various stepped surfaces such that the horizontal cross-sectional shape of the stepped cavity changes in steps as a function of the vertical distance from the top surface of the substrate semiconductor layer 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating stack is defined as the relative position of a pair of a first material layer and a second material layer within the structure. After formation of all stepped surfaces, mask material layers employed to form the stepped surfaces can be removed, for example, by ashing. Multiple photoresist layers and/or multiple etch processes can be employed to form the stepped surfaces.

A dielectric material such as silicon oxide is deposited in the stepped cavity and over the peripheral devices 210 in the peripheral device region 200. Excess portions of the deposited dielectric material can be removed from above the top surface of the first contact level dielectric layer 71, for example, by chemical mechanical planarization (CMP). The remaining portion of the deposited dielectric material filling the stepped cavity in the contact region 300 and overlying the substrate semiconductor layer 10 in the peripheral device region 200 constitutes a retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed as the dielectric material, the silicon oxide of the retro-stepped dielectric material portion 65 may, or may not, be doped with dopants such as B, P, and/or F. The top surface of the retro-stepped dielectric material portion 65 can be coplanar with the top surface of the first contact level dielectric layer 71.

The region over the peripheral devices 210 and the region over the stepped cavities can be filled simultaneously with the same dielectric material, or can be filled in different processing steps with the same dielectric material or with different dielectric materials. The cavity over the peripheral devices 210 can be filled with a dielectric material prior to, simultaneously with, or after, filling of the cavity over the stepped surface of the contact region 300 with a dielectric material. While the present disclosure is described employing an embodiment in which the cavity in the peripheral device region 200 and the stepped cavity in the contact region 300 are filled simultaneously, embodiments are expressly contemplated herein in which the cavity in the peripheral device region 200 and the stepped cavity in the contact region 300 are filled in different processing steps.

Figure 5:
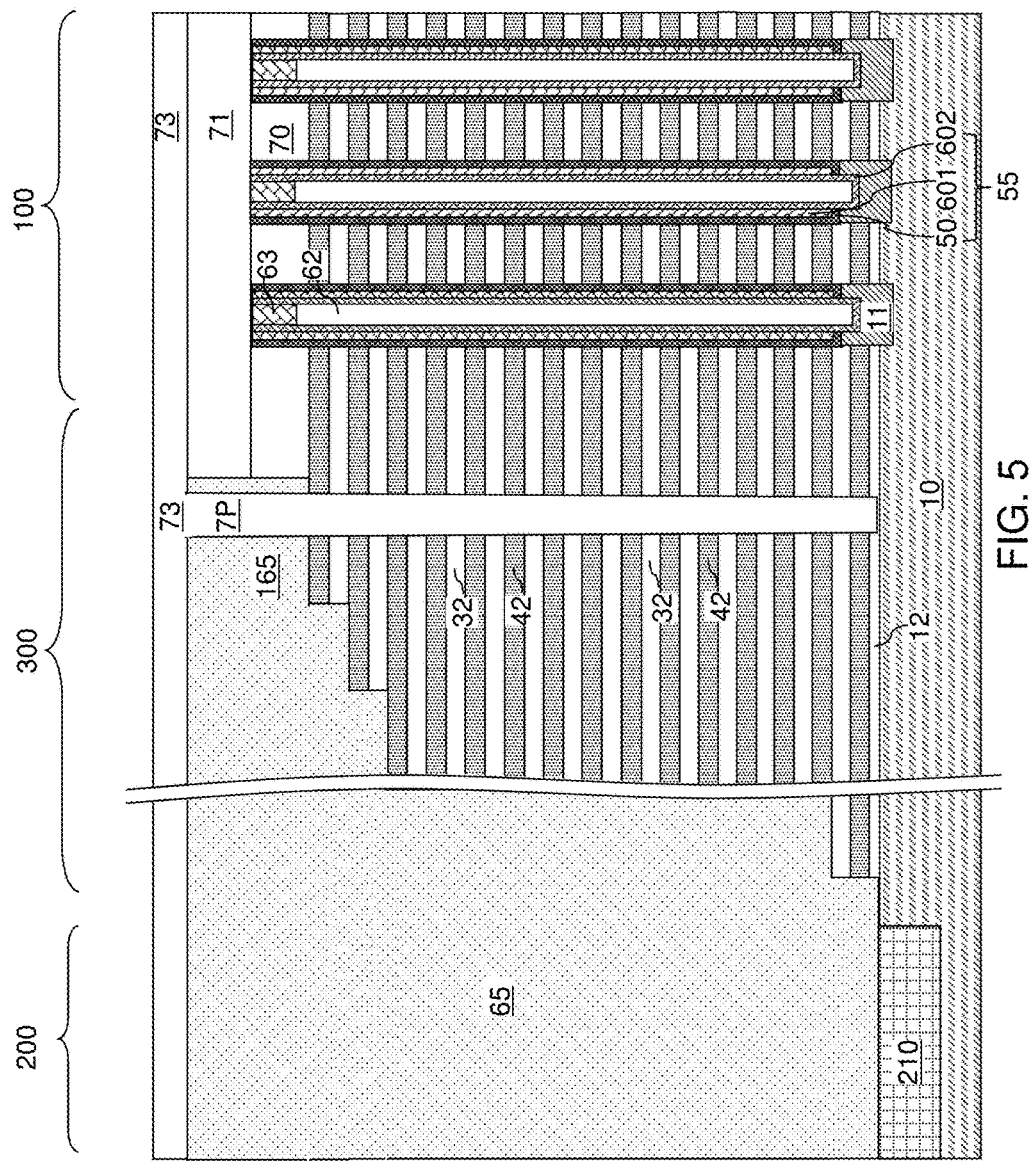
FIG. 5 is a vertical cross-sectional view of the first exemplary structure after formation of dielectric pillar structures according to the first embodiment of the present disclosure.

Referring to FIG. 5, dielectric support pillars 7P may be optionally formed through the retro-stepped dielectric material portion 65 and/or through the first contact level dielectric layer 71 and/or through the alternating stack (32, 42). In one embodiment, the dielectric support pillars 7P can be formed in the contact region 300, which is located adjacent to the device region 100. The dielectric support pillars 7P can be formed, for example, by forming an opening extending through the retro-stepped dielectric material portion 65 and/or through the alternating stack (32, 42) and at least to the top surface of the substrate semiconductor layer 10, and by filling the opening with a dielectric material that is resistant to the etch chemistry to be employed to remove the sacrificial material layers 42.

In one embodiment, the dielectric support pillars 7P can include silicon oxide and/or a dielectric metal oxide such as aluminum oxide. In one embodiment, the portion of the dielectric material that is deposited over the first contact level dielectric layer 71 concurrently with deposition of the dielectric support pillars 7P can be present over the first contact level dielectric layer 71 as a second contact level dielectric layer 73. Each of the dielectric support pillars 7P and the second contact level dielectric layer 73 is an optional structure. As such, the second contact level dielectric layer 73 may, or may not, be present over the insulating cap layer 70 and the retro-stepped dielectric material portion 65. The first contact level dielectric layer 71 and the second contact level dielectric layer 73 are herein collectively referred to as at least one contact level dielectric layer (71, 73). In one embodiment, the at least one contact level dielectric layer (71, 73) can include both the first and second contact level dielectric layers (71, 73), and optionally include any additional via level dielectric layer that can be subsequently formed. In another embodiment, the at least one contact level dielectric layer (71, 73) can include only the first contact level dielectric layer 71 or the second contact level dielectric layer 73, and optionally include any additional via level dielectric layer that can be subsequently formed. Alternatively, formation of the first and second contact level dielectric layers (71, 73) may be omitted, and at least one via level dielectric layer may be subsequently formed, i.e., after formation of a first source contact via structure.

The second contact level dielectric layer 73 and the dielectric support pillars 7P can be formed as a single continuous structure of integral construction, i.e., without any material interface therebetween. In another embodiment, the portion of the dielectric material that is deposited over the first contact level dielectric layer 71 concurrently with deposition of the dielectric support pillars 7P can be removed, for example, by chemical mechanical planarization or a recess etch. In this case, the second contact level dielectric layer 73 is not present, and the top surface of the first contact level dielectric layer 71 can be physically exposed.

Figure 6B:
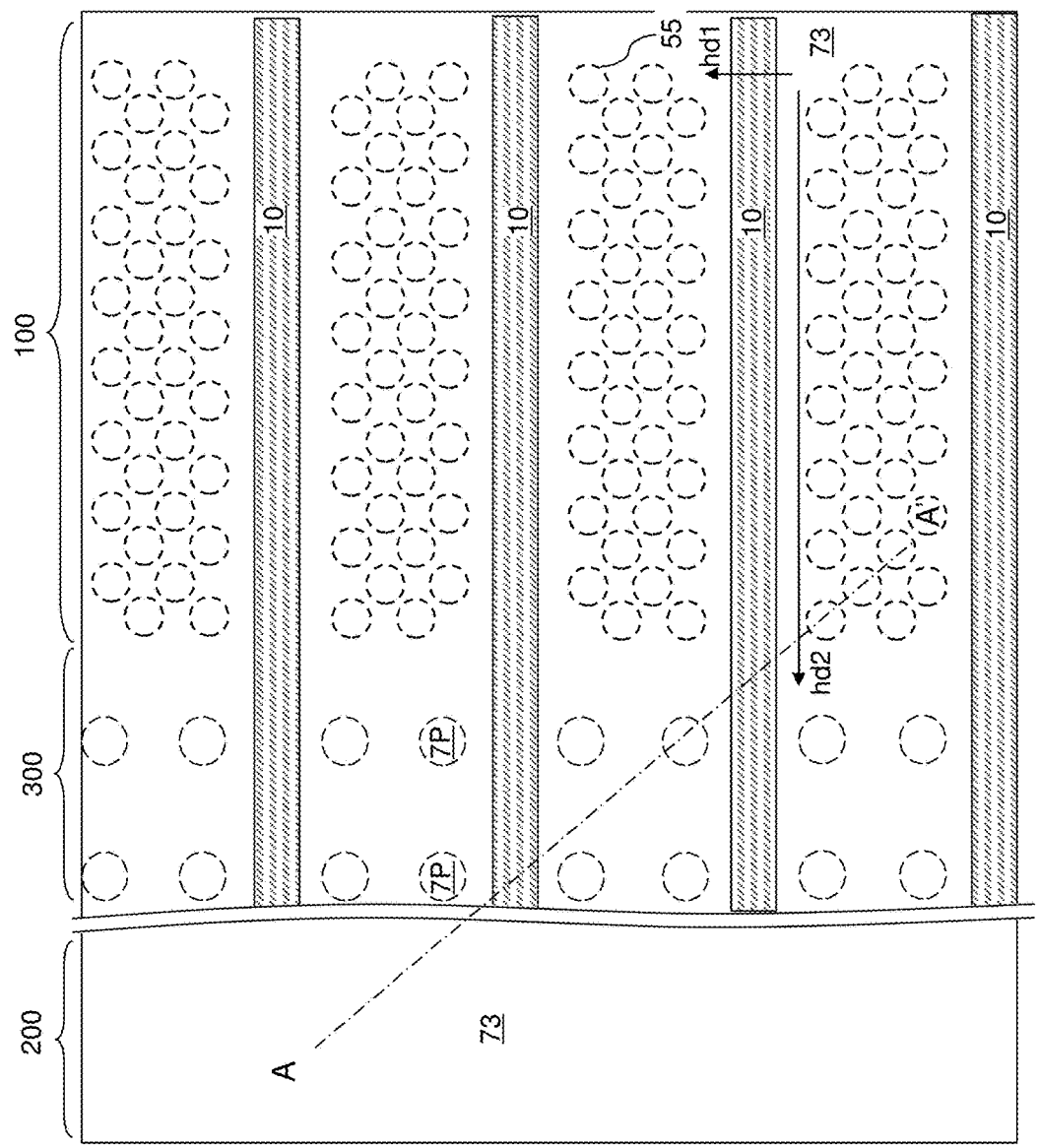
FIG. 6B is a see-through top-down view of the first exemplary structure of FIG. 6A. The vertical plane A-A' is the plane of the vertical cross-sectional view of FIG. 6A.

Referring to FIGS. 6A and 6B, a photoresist layer (not shown) can be applied over the at least one contact level dielectric layer (71, 73), and can be lithographically patterned to form openings within areas between the memory blocks. In one embodiment, the memory blocks can be laterally spaced from one another along a first horizontal direction hd1 (e.g., bit line direction), and the dimension of each opening in the photoresist layer along the first horizontal direction hd1 can be less than the spacing between neighboring clusters (i.e., sets) of the memory stack structures 55 along the second horizontal direction hd2 (e.g., word line direction). Further, the dimension of each opening in the photoresist layer along a second horizontal direction hd2 (which is parallel to the lengthwise direction of each cluster of memory stack structures 55) can be greater than the extent of each cluster of the memory stack structures 55 along the first horizontal direction hd1.

Backside trenches 79 can be formed between each neighboring pair of clusters of the memory stack structures 55 by transferring the pattern of the openings in the photoresist layer through the at least one contact level dielectric layer (71, 73), the retro-stepped dielectric material portion 65, and the alternating stack (32, 42). A top surface of the substrate semiconductor layer 10 can be physically exposed at the bottom of each backside trench 79. In one embodiment, each backside trench 79 can extend along the second horizontal direction hd2 so that clusters of the memory stack structures 55 are laterally spaced along the first horizontal direction hd1. Each cluster of memory stack structures 55 in conjunction with the portions of the alternating stack (32, 42) that surround the cluster constitutes a memory block. Each memory block is laterally spaced from one another by the backside trenches 79.

Figure 7:
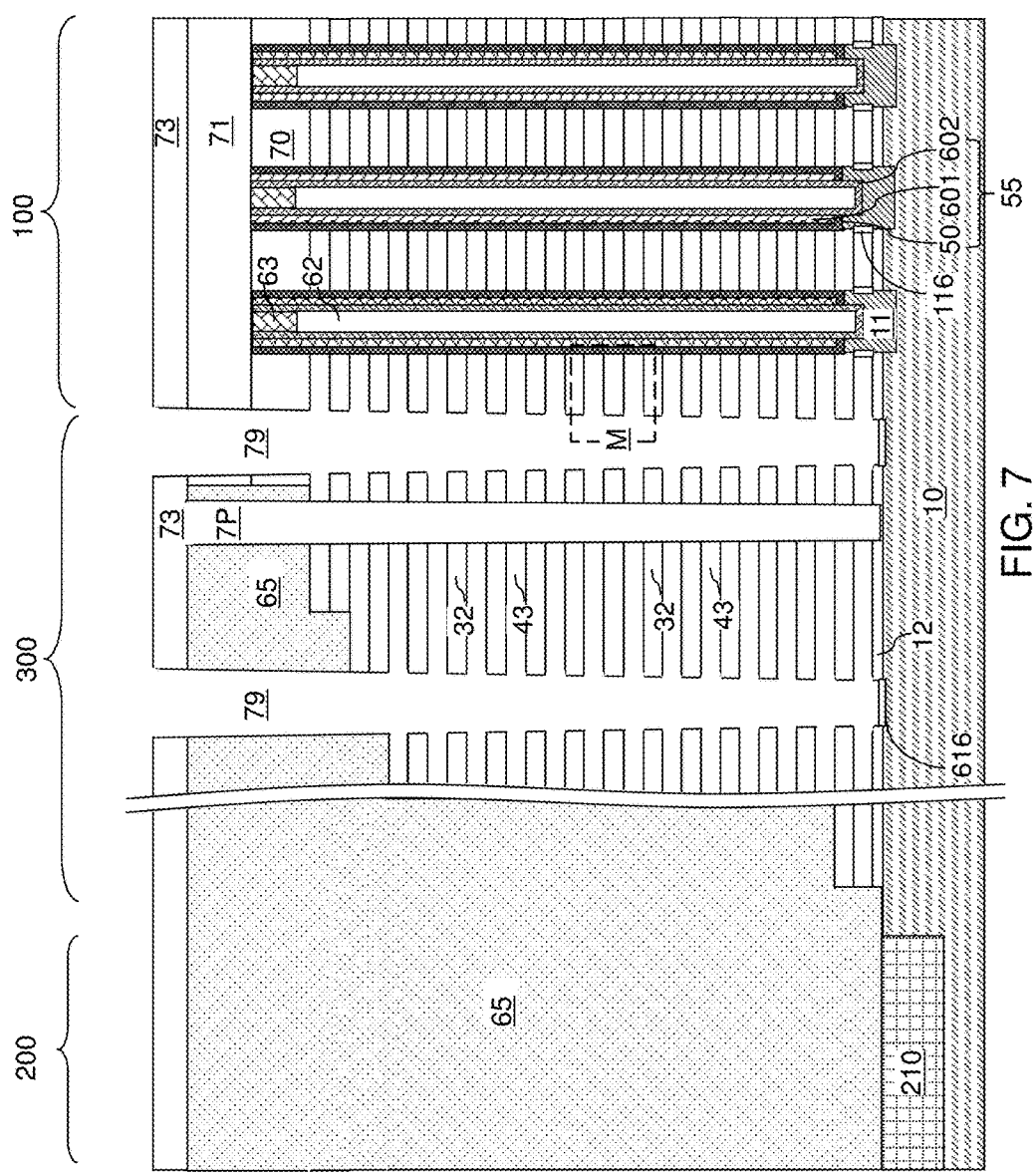
FIG. 7 is a vertical cross-sectional view of the first exemplary structure after formation of backside recesses according to the first embodiment of the present disclosure.

Referring to FIG. 7, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the dielectric support pillars 7P, the material of the retro-stepped dielectric material portion 65, the semiconductor material of the substrate semiconductor layer 10, and the material of the outermost layer of the first memory films 50. In one embodiment, the sacrificial material layers 42 can include silicon nitride, and the materials of the insulating layers 32, the dielectric support pillars 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the dielectric support pillars 7P, and the retro-stepped dielectric material portion 65 can be selected from silicon oxide, silicon nitride, and dielectric metal oxides. In this case, the depth of the backside trenches 79 can be modified so that the bottommost surface of the backside trenches 79 is located within the gate dielectric layer 12, i.e., to avoid physical exposure of the top surface of the substrate semiconductor layer 10.

The etch process that removes the second material selective to the first material and the outermost layer of the first memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The dielectric support pillars 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The first memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (e.g., above the substrate semiconductor layer 10). In this case, each backside recess 43 can define a space for receiving a respective word line of the array of monolithic three-dimensional NAND strings.

Each of the plurality of backside recesses 43 can extend substantially parallel to the top surface of the substrate semiconductor layer 10. A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Subsequently, physically exposed surface portions of epitaxial channel portions 11 and the source regions 61 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert a surface portion of each source region 61 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the source regions 61 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the source region 61.

A backside blocking dielectric layer (not shown) can be optionally formed. The backside blocking dielectric layer, if present, comprises a dielectric material that functions as a control gate dielectric for the control gates to be subsequently formed in the backside recesses 43. In case at least one blocking dielectric is present within each memory stack structure 55, the backside blocking dielectric layer is optional. In case a blocking dielectric is not present in the memory stack structures 55, the backside blocking dielectric layer is present.

Figure 8:
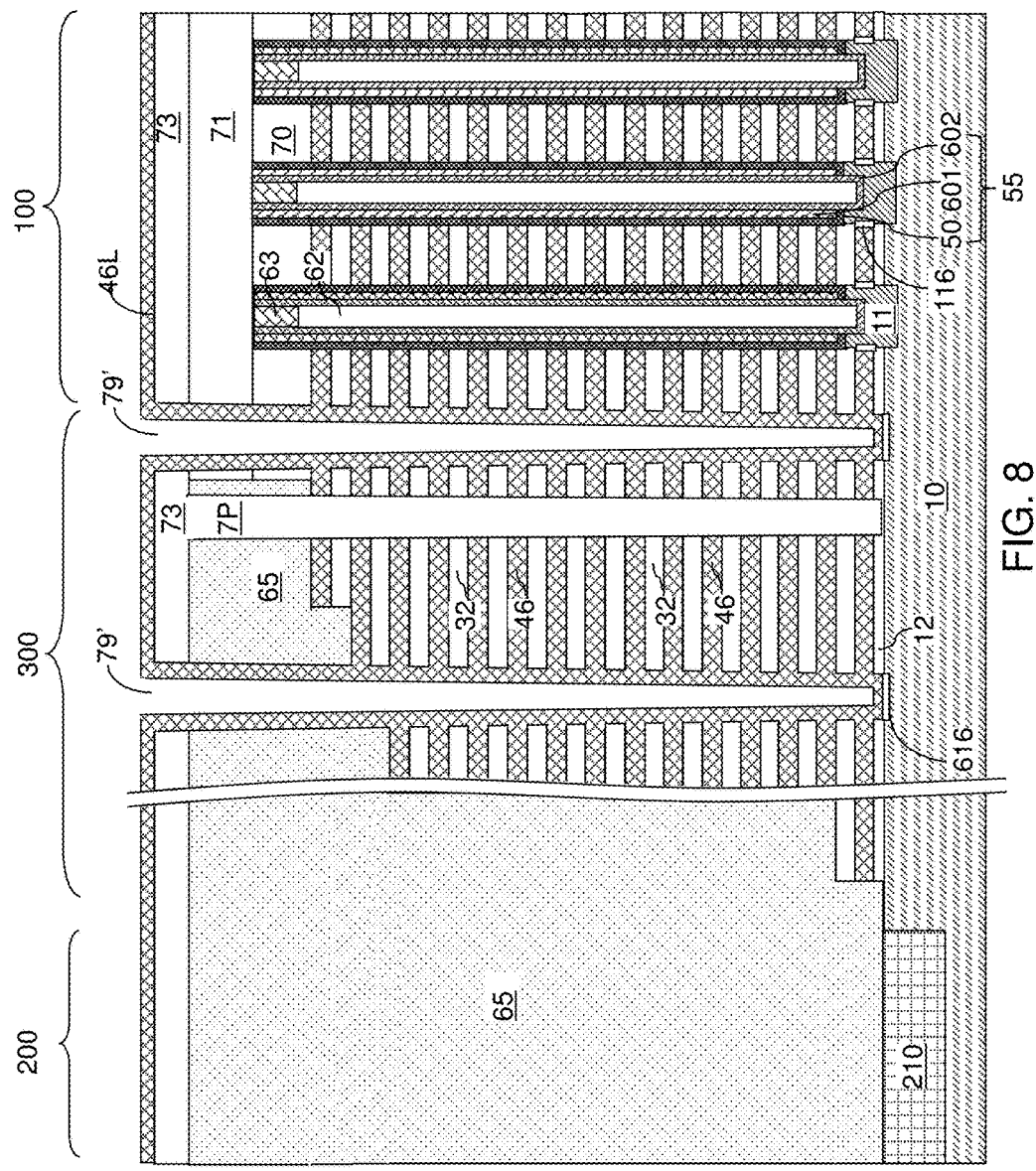
FIG. 8 is a vertical cross-sectional view of the first exemplary structure after deposition of a conductive material in the backside recesses and the backside trenches according to the first embodiment of the present disclosure.

Referring to FIG. 8, at least one conductive material is deposited in the backside recesses 43 and the backside trenches 79 employing at least one conformal deposition method such as chemical vapor deposition or atomic layer deposition. The portions of the at least one conductive material that are deposited in the backside recesses 43 constitute electrically conductive layers 46. The portions of the at least one conductive material that are deposited in the backside trenches and over the at least one contact level dielectric layer (71, 73) constitute a contiguous conductive material layer 46L. The contiguous conductive material layer 46L is a contiguous layer of the at least one conductive material that overlies sidewalls of the backside trenches 79 and the at least one contact level dielectric layer (71, 73).

The at least one conductive material can include a conductive metallic compound material that functions as a diffusion barrier material and/or an adhesion promoter material. For example, the conductive metallic compound material can comprise a conductive metallic nitride (such as TiN, TaN, or WN) or a conductive metallic carbide (such as TiC, TaC, or WC). The at least one conductive material can further include a conductive metal fill material such as Cu, W, Al, Co, Ni, Ru, Mo, Pt, or a combination thereof. In one embodiment, the at least one conductive material can include a stack of a conductive metallic compound material (such as TiN) and a conductive metal fill material (such as W or Co). The thickness of the deposited at least one conductive material is selected such that the electrically conductive layers 46 fill the entirety of the backside recesses 43, while a backside cavity 79' is present within each backside trench 79 after formation of the contiguous conductive material layer 46L.

Figure 9:
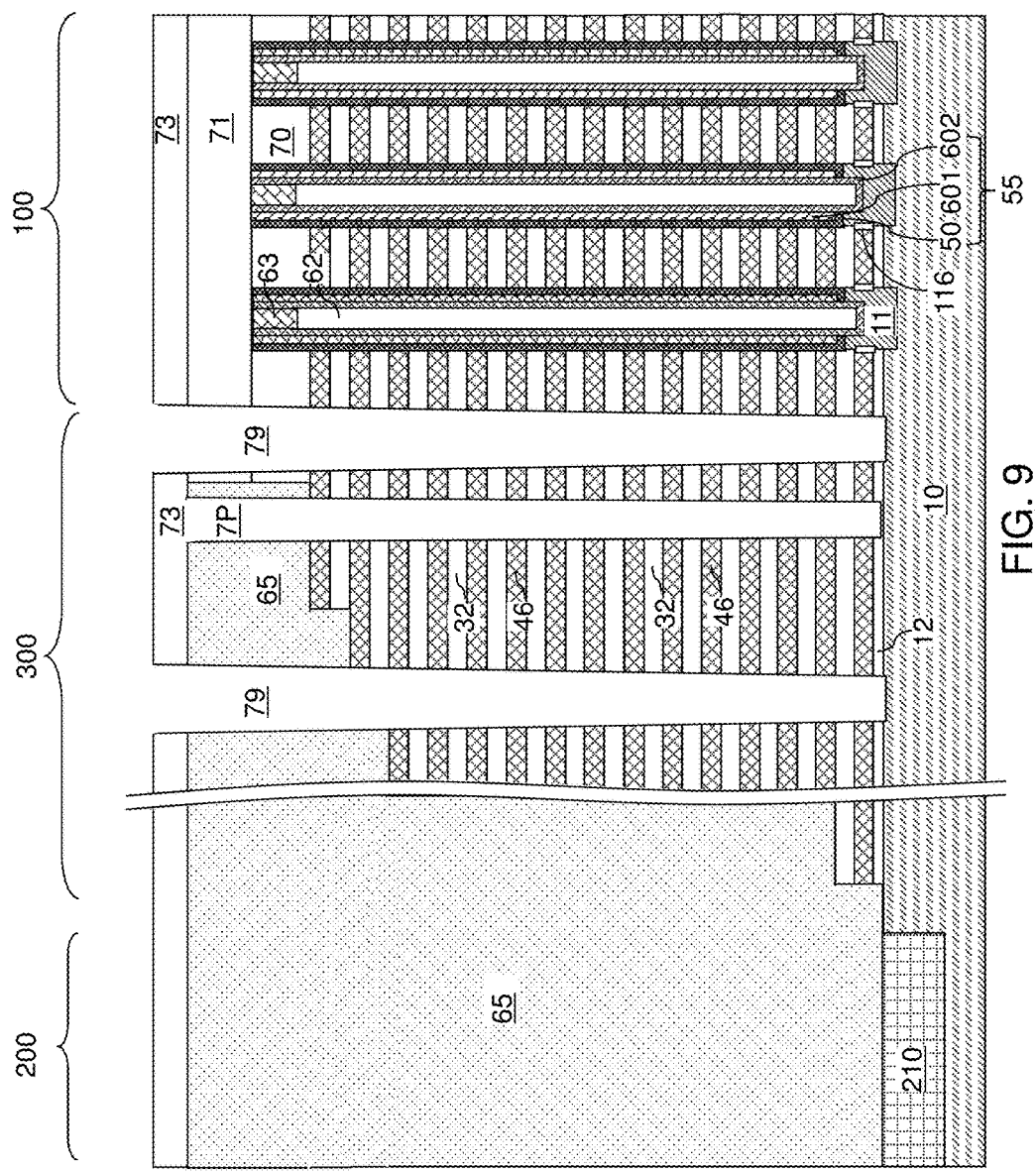
FIG. 9 is a vertical cross-sectional view of the first exemplary structure after removal of the conductive material from the backside trenches according to the first embodiment of the present disclosure.

Referring to FIG. 9, the contiguous conductive material layer 46L can be etched back by an etch process, while a predominant portion of each electrically conductive layers 46 is not etched. In one embodiment, an anisotropic or an isotropic etch can be employed to remove the material(s) of the contiguous conductive material layer 46L. For example, a wet etch chemistry employing a mixture of hydrofluoric acid and nitric acid, a mixture of nitric acid and hydrogen peroxide, a mixture of hydrochloric acid and hydrogen peroxide, sulfuric acid, or aqua regia may be employed to isotropically etch back the metallic material(s) of the contiguous conductive material layer 46L. The contiguous conductive material layer 46L is removed from inside the backside trenches 79 and from above the at least one contact level dielectric layer (71, 73) by the etch process. The electrically conductive layers 46 remain in the volumes of the backside recesses 43 after the etch process.

Subsequently, the sacrificial dielectric portions 616 can be removed by an anisotropic etch. A top surface of a single crystalline semiconductor material portion within the substrate semiconductor layer 10 is physically exposed at the bottom of each backside trench 79 after removal of the sacrificial dielectric portions 616.

Each electrically conductive layer 46 can function as a combination of a plurality of control gate electrodes and a word line electrically connecting, i.e., electrically shorting, the plurality of control gate electrodes. The plurality of control gate electrodes within each electrically conductive layer 46 can include control gate electrodes located at the same level for the vertical memory devices including the memory stack structures 55. In other words, each electrically conductive layer 46 can be a word line that functions as a common control gate electrode for the plurality of vertical memory devices.

Figure 10:
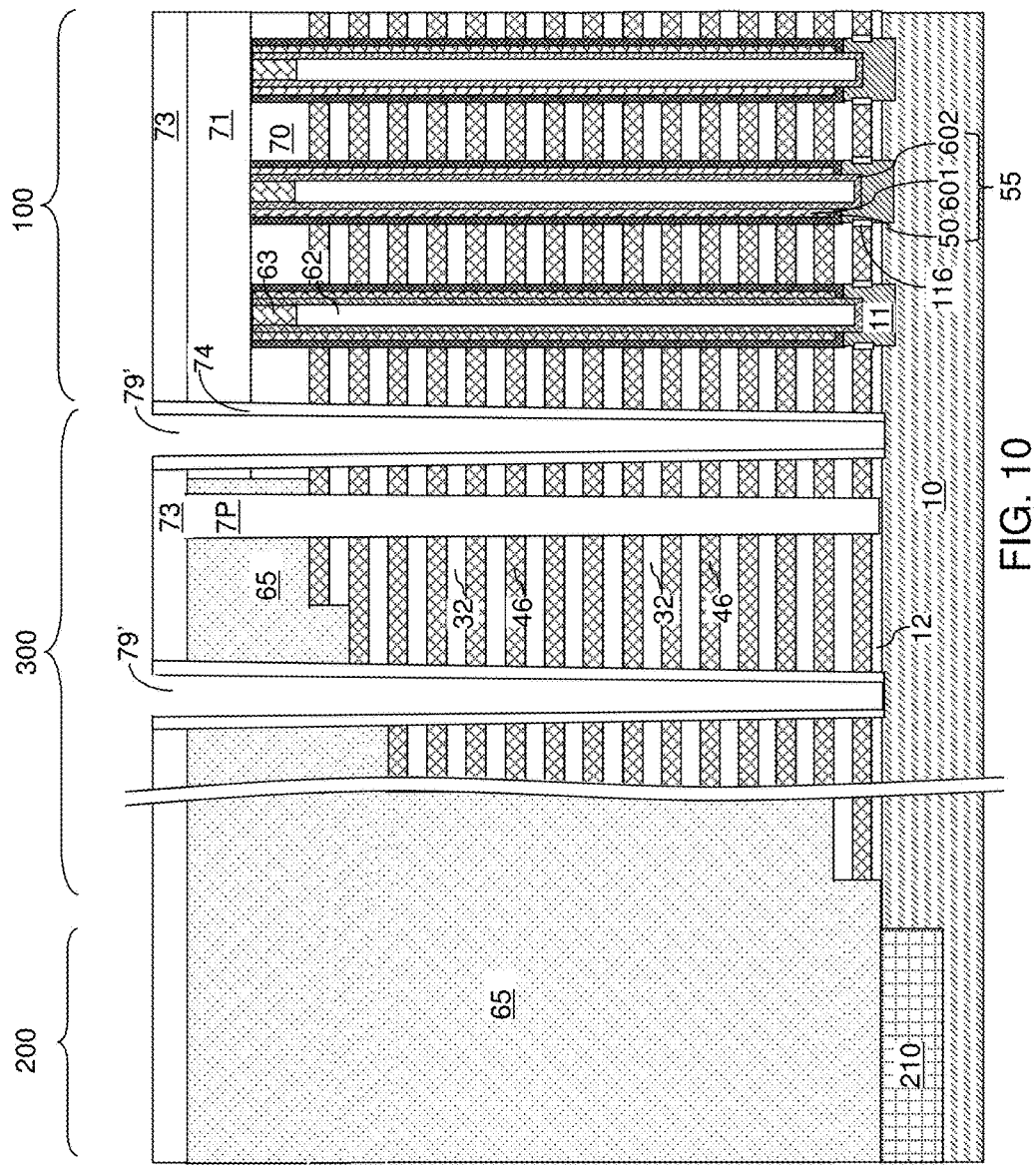
FIG. 10 is a vertical cross-sectional view of the first exemplary structure after formation of insulating spacers according to the first embodiment of the present disclosure.

Referring to FIG. 10, an insulating material layer is conformally deposited in the backside trenches 79 and over the at least one contact level dielectric layer (71, 73). The insulating material layer includes an insulating material such as silicon oxide, silicon nitride, silicon oxynitride, and/or a dielectric metal oxide. The thickness of the insulating material layer is selected such that a backside cavity 79' is present within each backside trench 79 after deposition of the insulating material layer.

The insulating material layer is anisotropically etched to remove horizontal portions. Each remaining vertical portion of the insulating material layer constitutes an insulating spacer 74 that laterally surrounds a respective backside cavity 79'.

Figure 11:
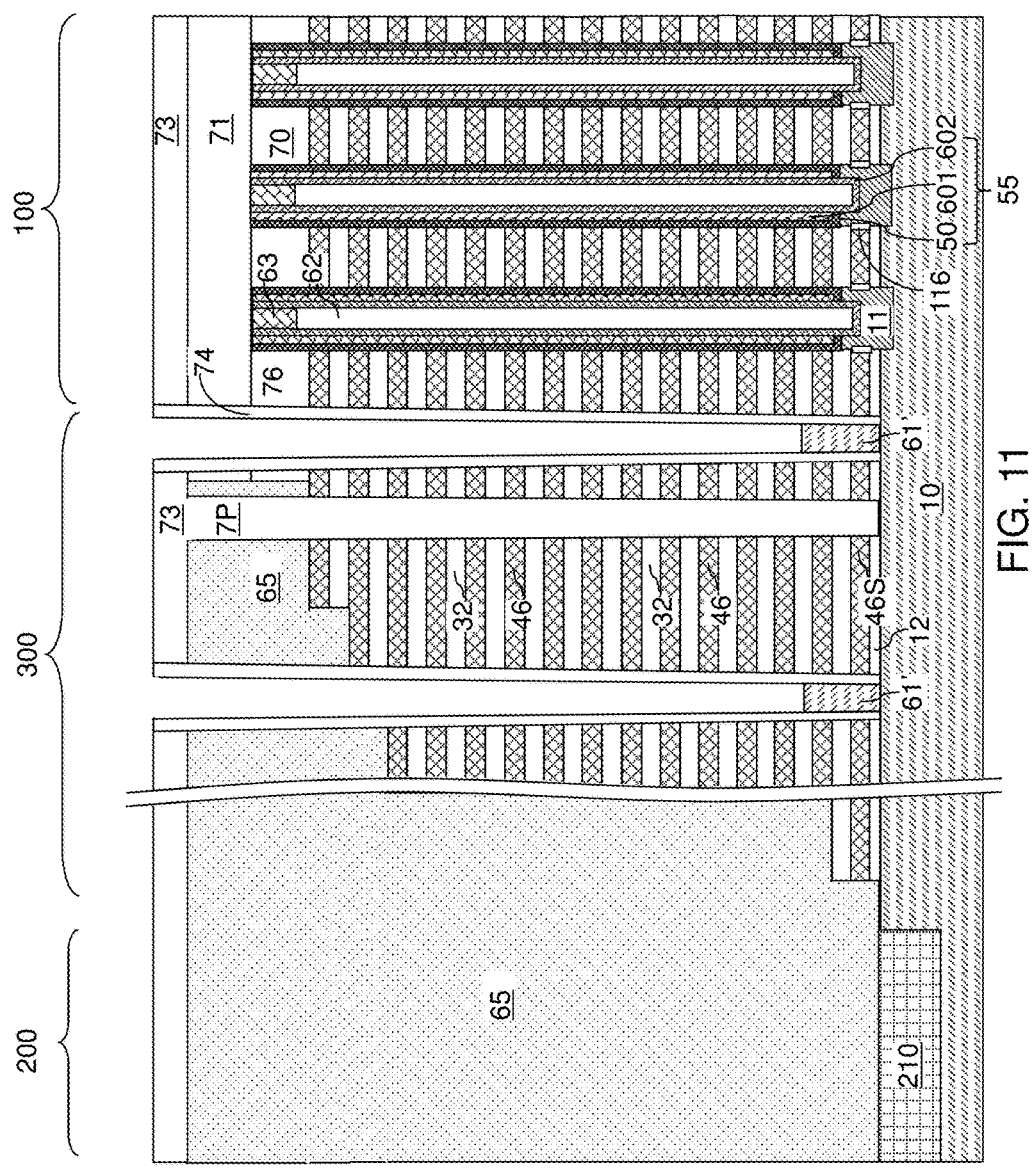
FIG. 11 is a vertical cross-sectional view of the first exemplary structure after formation of epitaxial pillar structures according to the first embodiment of the present disclosure.

Referring to FIG. 11, epitaxial pillar structures 61' are formed at the bottom of each backside cavity 79' employing a selective epitaxy process. The epitaxial pillar structures 61' include a semiconductor material, which can be an elemental semiconductor material (such as silicon or germanium), a compound semiconductor material (such as silicon germanium), or a combination thereof. In one embodiment, the epitaxial pillar structures 61' can include an undoped semiconductor material or a doped semiconductor material. As used herein, an "undoped semiconductor material" refers to a semiconductor material deposited by a deposition process that does not provide any dopant gas into a process chamber. An undoped semiconductor material may be intrinsic, or may have a low level of autodoping, i.e., doping caused by residual dopants provided by a substrate or a process chamber during the deposition process. A "doped semiconductor material" refers to a semiconductor material having a substantial level of doping, for example, due to electrical dopants that are present at an atomic concentration greater than $1.0 \times 10^{16}/cm^3$.

The selective epitaxy process employs concurrent flow or alternate flow of at least one reactant gas and at least one etchant gas. The at least one reactant gas can include, for example, $SiH_4$, $SiH_2Cl_2$, $SiHCl_3$, $SiCl_4$, $Si_2H_6$, $GeH_4$, $Ge_2H_6$, any other known organic or inorganic precursor gas for a semiconductor material, or a combination thereof. An example of an etchant gas is HCl. Semiconductor surfaces and dielectric surfaces provide different nucleation rates, and thus, deposition rates, for deposition of the semiconductor material derived from the at least one reactant gas. Specifically, semiconductor surfaces provide a higher nucleation rate, and thus, a higher deposition rate, than dielectric surfaces. The etch rate of the semiconductor material is independent of the underlying surfaces.

The flow rates of the at least one reactant gas and the etchant gas are selected such that the deposition rate is greater than the etch rate on semiconductor surfaces, while the deposition rate is less than the etch rate on the dielectric surfaces. Thus, the deposition of the semiconductor material initially occurs only on the physically exposed semiconductor surfaces of the substrate semiconductor layer 10 to form in-process epitaxial pillar structures, while the semiconductor material is not deposited on the physically exposed dielectric surfaces of the insulating spacers 74 and the at least one contact level dielectric layer (71, 73). Upon formation of the in-process epitaxial pillar structures, the deposition of the semiconductor material occurs only on the surfaces of the in-process epitaxial pillar structures, while the semiconductor material is not deposited on the physically exposed dielectric surfaces of the insulating spacers 74 and the at least one contact level dielectric layer (71, 73).

The selective deposition process proceeds until the height of the in-process epitaxial pillar structures reach a target height, thereby completing formation of the epitaxial pedestal structures 61'. Each epitaxial pedestal structure 61' is formed on the top surface of, and in epitaxial alignment with, the single crystalline semiconductor material portion that underlies the backside trenches 79 and is present at an upper portion of the substrate semiconductor layer 10. Each epitaxial pedestal structure 61' contacts a sidewall of a respective insulating spacer 74. The height of the top surfaces of the epitaxial pedestal structures 61' can be above the height of the bottom surface of the bottommost electrically conductive layer 46S, and may be above the height of the top surface of the bottommost electrically conductive layer 46S. Layer 46S may comprise a select gate electrode of a source side select transistor, as described in more detail below. Optionally, the height of the top surfaces of the epitaxial pedestal structures 61' can be at, or above, a second-from-bottom electrically conductive layer 46, i.e., the electrically conductive layer 46 that is located directly above the bottommost electrically conductive layer 46S. If desired, the height of the top surfaces of the epitaxial pedestal structures 61' may be above the height of the top surfaces of the epitaxial channel portions 11. The height of the top surfaces of the epitaxial channel portions is preferably below the lowest control gate electrode 46 in the stack. In other words, portions 11 may extend at the height of one or more select gate electrodes 46S, but are preferably located below the control gate electrodes 46.

The semiconductor composition of the epitaxial pedestal structures 61' can be the same as, or different from, the semiconductor composition of the epitaxial channel portions 11. As used herein, a "semiconductor composition" of an element refers to the composition of the intrinsic component of the semiconductor material of the element, which is the composition of the element less all electrical dopants (i.e., p-type dopants and n-type dopants). Thus, the composition of the epitaxial pedestal structures 61' refers to the composition of all elements of the epitaxial pedestal structures 61' less the electrical dopants in the epitaxial pedestal structures 61'.

In one embodiment, the semiconductor composition of the epitaxial pedestal structures 61' can be the same as the semiconductor composition of the epitaxial channel portions 11. For example, the semiconductor composition of the epitaxial pedestal structures 61' and the epitaxial channel portions 11 can be 100% silicon. In another embodiment, the semiconductor composition of the epitaxial pedestal structures 61' can be different from the semiconductor composition of the epitaxial channel portions 11. For example, one of the epitaxial pedestal structures 61' and the epitaxial channel portions 11' can have a semiconductor composition of 100% silicon, and the other of the epitaxial pedestal structures 61' and the epitaxial channel portions 11' can have a semiconductor composition of a silicon-germanium alloy.

In one embodiment, the semiconductor composition of the epitaxial pedestal structures 61' can be the same as the semiconductor composition of the substrate semiconductor layer 10. For example, the semiconductor composition of the epitaxial pedestal structures 61' and the substrate semiconductor layer 10 can be 100% silicon. In another embodiment, the semiconductor composition of the epitaxial pedestal structures 61' can be different from the semiconductor composition of the substrate semiconductor layer 10. For example, one of the epitaxial pedestal structures 61' and the substrate semiconductor layer 10 can have a semiconductor composition of 100% silicon, and the other of the epitaxial pedestal structures 61' and the substrate semiconductor layer 10 can have a semiconductor composition of a silicon-germanium alloy.

Figure 12A:
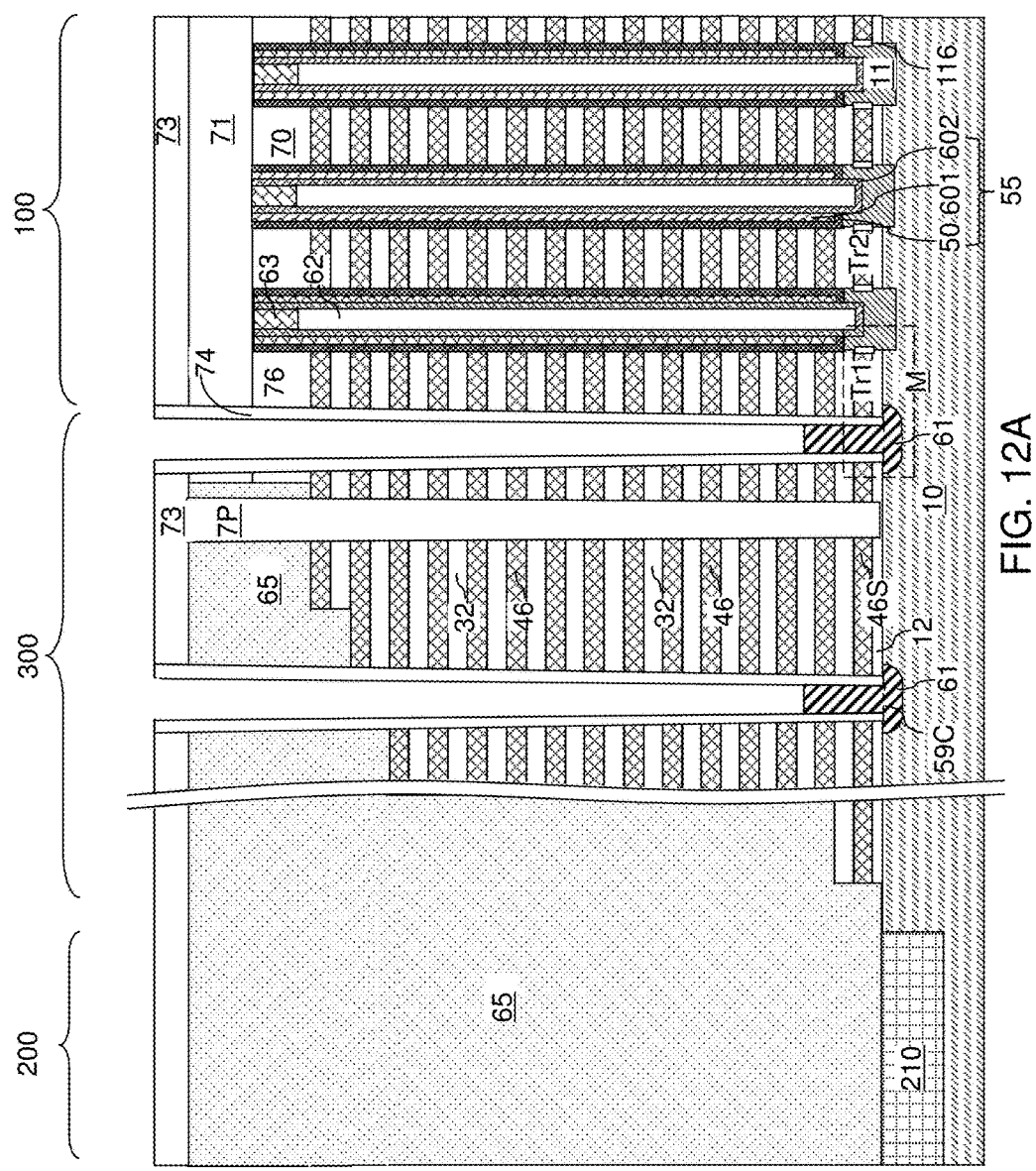
FIG. 12A is a vertical cross-sectional view of the first exemplary structure after formation of source regions according to the first embodiment of the present disclosure.
Figure 12B:
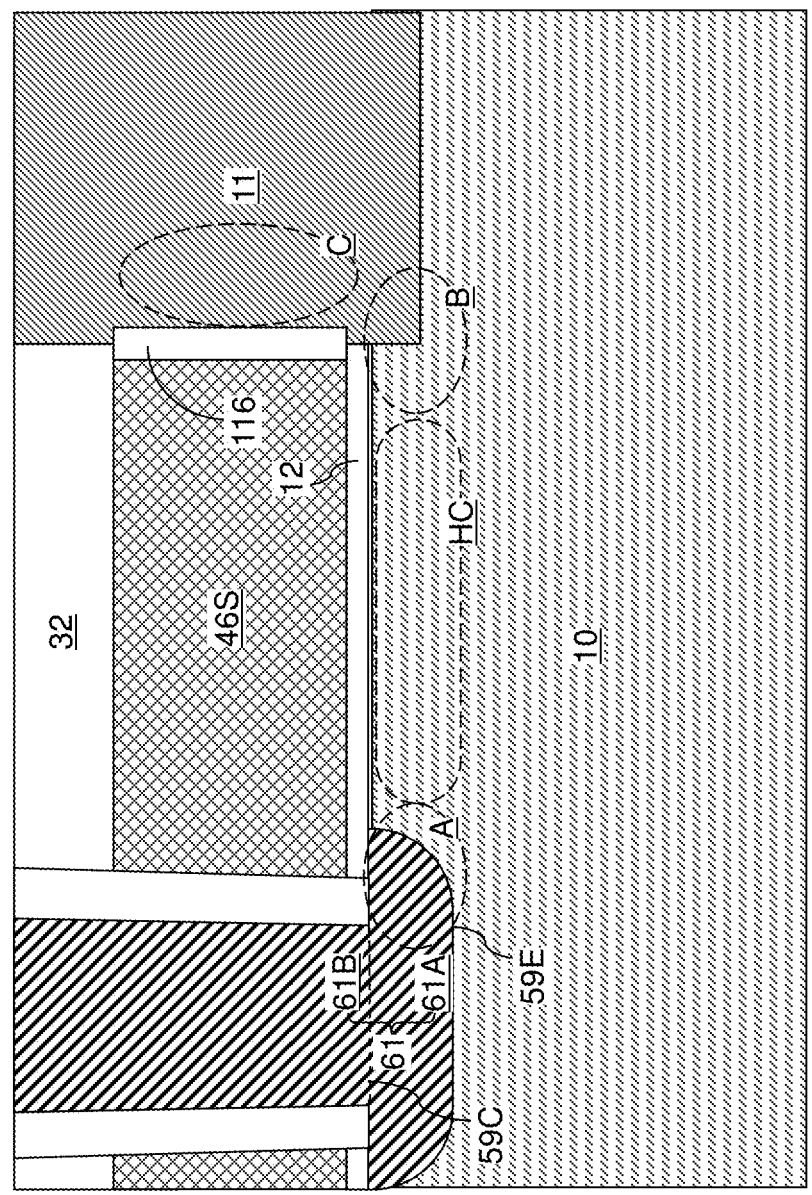
FIG. 12B is a vertical cross-sectional view of a magnification region M in FIG. 12A.

Referring to FIGS. 12A and 12B, electrical dopants (i.e., p-type dopants or n-type dopants) can be introduced into the epitaxial pedestal structures 61' and optionally into portions of the substrate semiconductor layer 10 that underlie the backside trenches 79. The electrical dopants can be introduced into the epitaxial pedestal structures 61' and optionally into the underlying portions of the substrate semiconductor layer 10 by in-situ doping during the selective epitaxy of the epitaxial pedestal structures 61' (for example, by flowing a dopant gas concurrently with the flow of the at least one semiconductor precursor gas). Alternatively or additionally, the electrical dopants can be introduced into the epitaxial pedestal structures 61' and optionally into the underlying portions of the substrate semiconductor layer 10 by ion implantation after formation of the epitaxial pedestal structures 61'. The conductivity type of the electrical dopants introduced into the epitaxial pedestal structures 61' can be the opposite of the conductivity type of the substrate semiconductor layer 10, and the same as the conductivity of the drain regions 63. For example, the substrate semiconductor layer 10 can have a doping of the first conductivity type, and the drain regions 63 and the electrical dopants introduced into the epitaxial pedestal structures 61' can have a doping of the second conductivity type that is the opposite of the first conductivity type. The first conductivity type can be p-type and the second conductivity type can be n-type, or vice versa. The epitaxial channel portions 11 and the semiconductor channels (601, 602) can be undoped, or can have a doping of the first conductivity type.

A source region 61 is formed by the introduction of the electrical dopants of the second conductivity type into the epitaxial pedestal structures 61' and the underlying portions of the substrate semiconductor layer 10. Each source region 61 includes the entire contiguous volume that has a doping of the second conductivity type, and forms a p-n junction with the portion of the substrate semiconductor layer 10 that has a doping of the first conductivity type. During formation of each source region 61, an epitaxial pedestal structure 61' and a surface region of the single crystalline semiconductor material portion of the substrate semiconductor layer 10 that underlies the epitaxial pedestal structure 61' are doped with the electrical dopants of the second conductivity type, and become a source region 61, which is a continuous semiconductor material portion having a doping of the second conductivity type. In an alternative embodiment, the top of the memory stack structures 55 may be exposed at the same time as the top of the epitaxial pedestal structures 61', for example, by forming openings through layers 71 and 73. In this case, the source 61 and drain 63 regions may be formed at the same time by ion implantation of dopants of the second conductivity type (e.g., n-type) into the structures 61' and 55 during the same implantation step.

As shown in FIG. 12B, each source region 61 comprises a substrate source portion 61A located in the substrate (e.g., in the substrate semiconductor layer 10) and an epitaxial pedestal source portion 61B overlying, and in epitaxial alignment, with the substrate source portion 61A. The substrate source portion 61A has the same semiconductor composition as the remaining portion of the substrate semiconductor layer 10, i.e., the portion of the substrate semiconductor layer 10 that has a doping of the first conductivity type. Particularly, the substrate source portion 61A of the second conductivity type is in epitaxial alignment with a horizontal channel portion HC of the first conductivity type, which is a portion of the channel of a field effect transistor. The field effect transistor (e.g., NAND memory device) includes a drain region 63, a semiconductor channel (601, 602) underlying and contacting the drain region 63, an epitaxial channel portion 11 in contact with the semiconductor channel (601, 602), the horizontal channel portion HC in contact with the epitaxial channel portion 11, and the source region 61 in contact with the horizontal channel portion HC. The combination of the horizontal channel portion HC, the epitaxial channel portion 11, and the semiconductor channel (601, 602) collectively constitute the channel of the field effect transistor. Each source region 61 is epitaxially aligned to the single crystalline structure of an adjacent horizontal channel portion HC. Further, each epitaxial channel portion 11 is epitaxially aligned to an adjacent horizontal channel portion HC. Portions HC and 11 form a channel of a source side select transistor Tr1 containing select gate electrode 46S. A p-n junction between the source region 61 and the substrate semiconductor layer 10 can be vertically offset from the interface 59C between the substrate source portion 61A and the epitaxial pedestal source portion 61B.

In case ion implantation is employed, an anneal at an elevated temperature is performed to heal structural damage in the source region 61, and to activate the electrical dopants of the second conductivity type by diffusing the electrical dopants from interstitial sites to substitutional sites. The anneal can modify the vertical doping profile because the electrical dopants diffuse during the anneal.

Figure 12C:
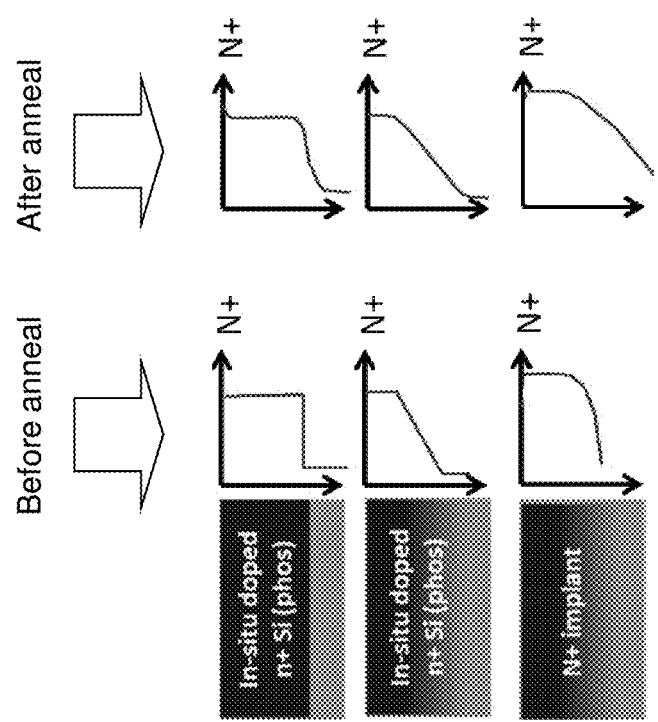
FIG. 12C illustrate various types of vertical dopant concentration profile in a source region of FIG. 12A.

FIG. 12C illustrates various exemplary vertical doping profiles that can be employed to form the source regions 61 before and after the anneal. Specifically, stepped or graded second conductivity (e.g., n-type) dopant profiles may be achieved. For example, a stepped phosphorus doping profile may be achieved by in-situ doping of silicon epitaxial pedestal structures 61' during a relatively low temperature epitaxial growth. If the growth temperature is increased, then an intermediate profile may be achieved due to phosphorus diffusion into the substrate semiconductor layer 10 during epitaxial growth. If phosphorus or arsenic ion implantation is used, then the implanted phosphorus ions may diffuse deeper into the source region to achieve a graded dopant profile after the anneal.

Figures 12D, 12E:
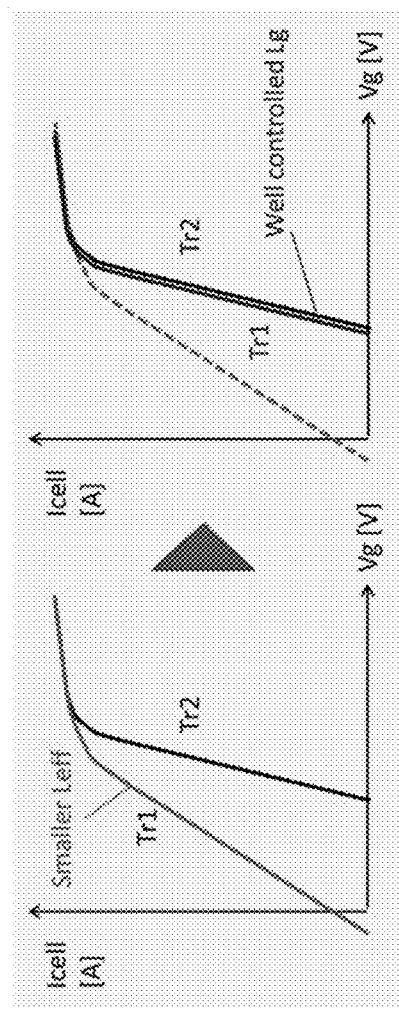
FIGS. 12D and 12E are schematic current-voltage plots of memory devices according to the prior art and according to embodiments of the present disclosure, respectively.

In one embodiment, the epitaxial pedestal structures 61' provide a more uniform threshold voltage ($V_{th}$) distribution for the bottom select transistors (e.g., Tr1, Tr2) of each NAND string located in the respective memory opening. FIG. 12D illustrates a typical current-voltage ($I_{cell}$-$V_g$) characteristic of a prior art NAND device that lacks the epitaxial pedestal structures 61'. As shown in this figure, the first bottom (source side) select transistor Tr1 which is located closer to the source region 61 (e.g., closer to the trench 79) has smaller effective gate length ($L_{eff}$) than the second bottom select transistor Tr2 which is located farther from the source region 61 (e.g., farther from the trench 79). Thus, the subthreshold swing of the first and second select transistors is different from each other, leading to non-uniform performance of the NAND strings in the array.

FIG. 12E illustrates a calculated current-voltage ($I_{cell}$-$V_g$) characteristic of a NAND device of an embodiment of the present disclosure that includes the epitaxial pedestal structures 61'. As shown in this figure, the current-voltage ($I_{cell}$-$V_g$) characteristic is improved compared to that of FIG. 12D. The gate length ($L_g$) is better controlled and is more uniform for both select transistors Tr1 and Tr2. Thus, the subthreshold characteristic and threshold voltage of both select transistors is expected to be more uniform (i.e., closer to each other) than in the prior art device.

Referring again to FIG. 12B, the threshold voltage of a select transistor depends on the structure of the transistor in region A adjacent to the source region 61/trench 79, and the structure of the transistor in region B adjacent to the bottom of the memory opening 49.

Without wishing to be bound by a particular theory, it is believed that when a gate to drain voltage (Vg~Vdd) is applied, a strong inversion layer is formed in region C in the epitaxial channel portions 11 in the memory openings 49, and in the horizontal channel portion HC directly under the select gate electrode 46S. However, a weak inversion layer is formed in regions A and B adjacent to (i.e., under) insulating layers (i.e., under insulating spacer 74 and select transistor gate dielectric layer 12) at the corners of the select gate electrode 46S because the corners of select gate electrode does not have a sufficient electric field to form a strong inversion layers. Thus, the select transistor threshold voltage is defined by the select gate electrode corner regions A and B.

As shown in FIG. 12B, in one embodiment of the present disclosure, the source region 61 (i.e., portion 61B) of the second conductivity type (e.g., n-type) extends into region A. Therefore, there is no channel region of the second conductivity type (e.g., p-type) located under the insulating spacer 74 at the corner of the select gate electrode 46S in region A, and this region A does not affect the threshold voltage of the select transistors.

In contrast, since region B at the bottom of the memory opening is the same for all source side select transistors (e.g., Tr1 and Tr2) irrespective of whether the select transistor is located closer to or farther from the source region 61. Thus, the second conductivity type dopants from the source region 61 are preferably not diffused into regions B of each select transistor to leave the channel of the first conductivity type in regions B. This makes the uniform regions B the key factor for setting the threshold voltage of all source side select transistors. Therefore, the epitaxial pedestal structures provide a more uniform effective gate length and improve the threshold voltage margin of bottom (i.e., source side) select transistors of the NAND device.

The above features provide an areal overlap between the gate dielectric layer 12 and the source region 61 in region B. Furthermore, the lateral extent of the diffusion of the dopants of the second conductivity type is controlled such that the source region 61 does not extend to region B in which the horizontal channel portion HC contacts the epitaxial channel portion 11. The combination of the profiles of region A and region B provides a stable threshold voltage for the field effect transistors that share the horizontal channel portion HC and the source region 61.

Figure 13:
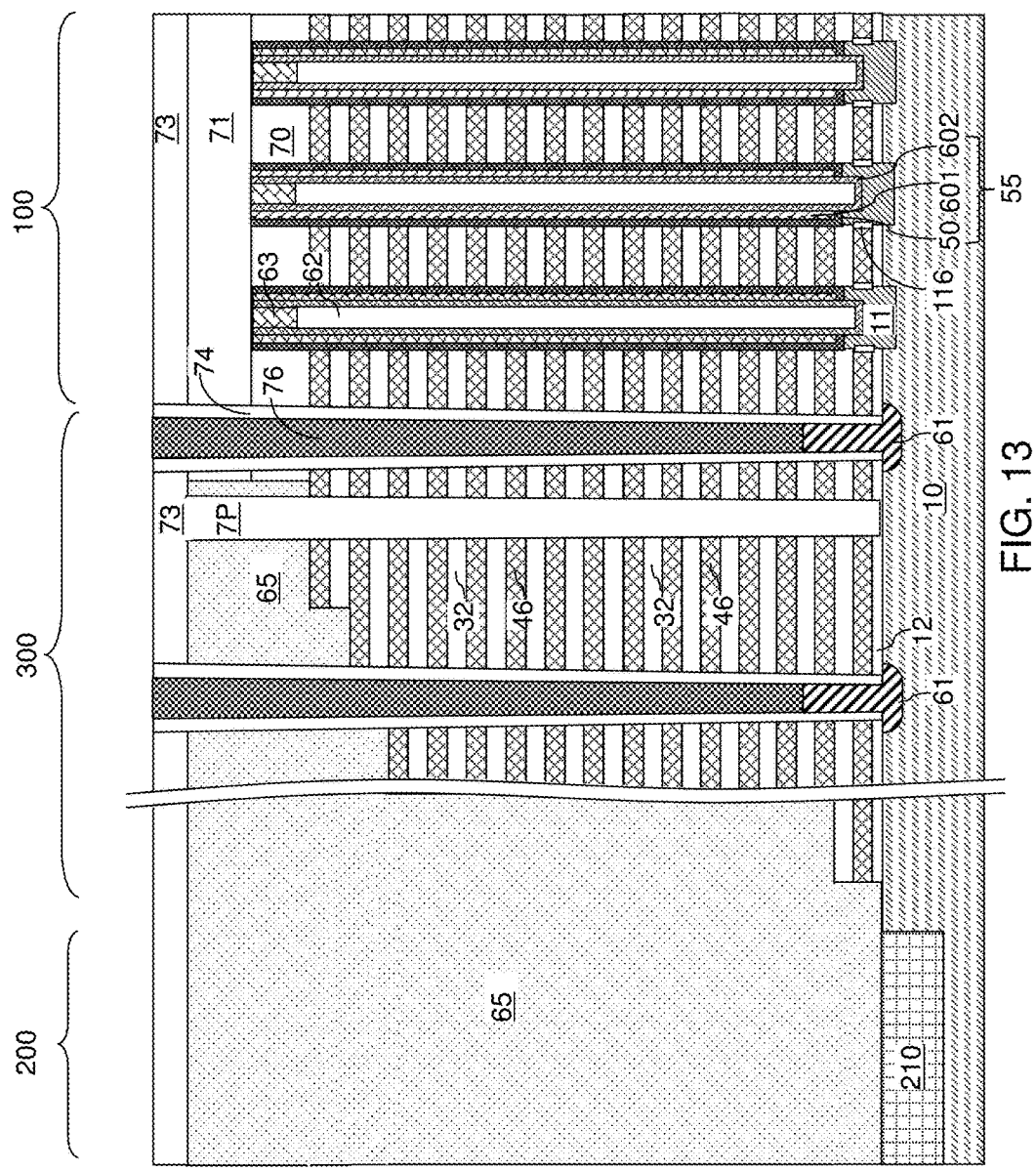
FIG. 13 is a vertical cross-sectional view of the first exemplary structure after formation of backside contact via structures according to the first embodiment of the present disclosure.

Referring to FIG. 13, at least one conductive material is deposited in the backside cavities 49'. The at least one conductive material can include a conductive metallic liner material and a metallic fill material. For example, the conductive metallic liner material can include a metal nitride (such as TiN, TaN, or WN), and the metallic fill material can include a metal (such as W, Cu, Al, Co, Ru, Mo, Pt, or an alloy thereof). Excess portions of the at least one conductive material can be removed from above the top surface of the at least one contact level dielectric layer (71, 73). Each remaining portion of the at least one conductive material constitute a backside contact via structure 76, which can be a source contact via structure.

Figure 14A:
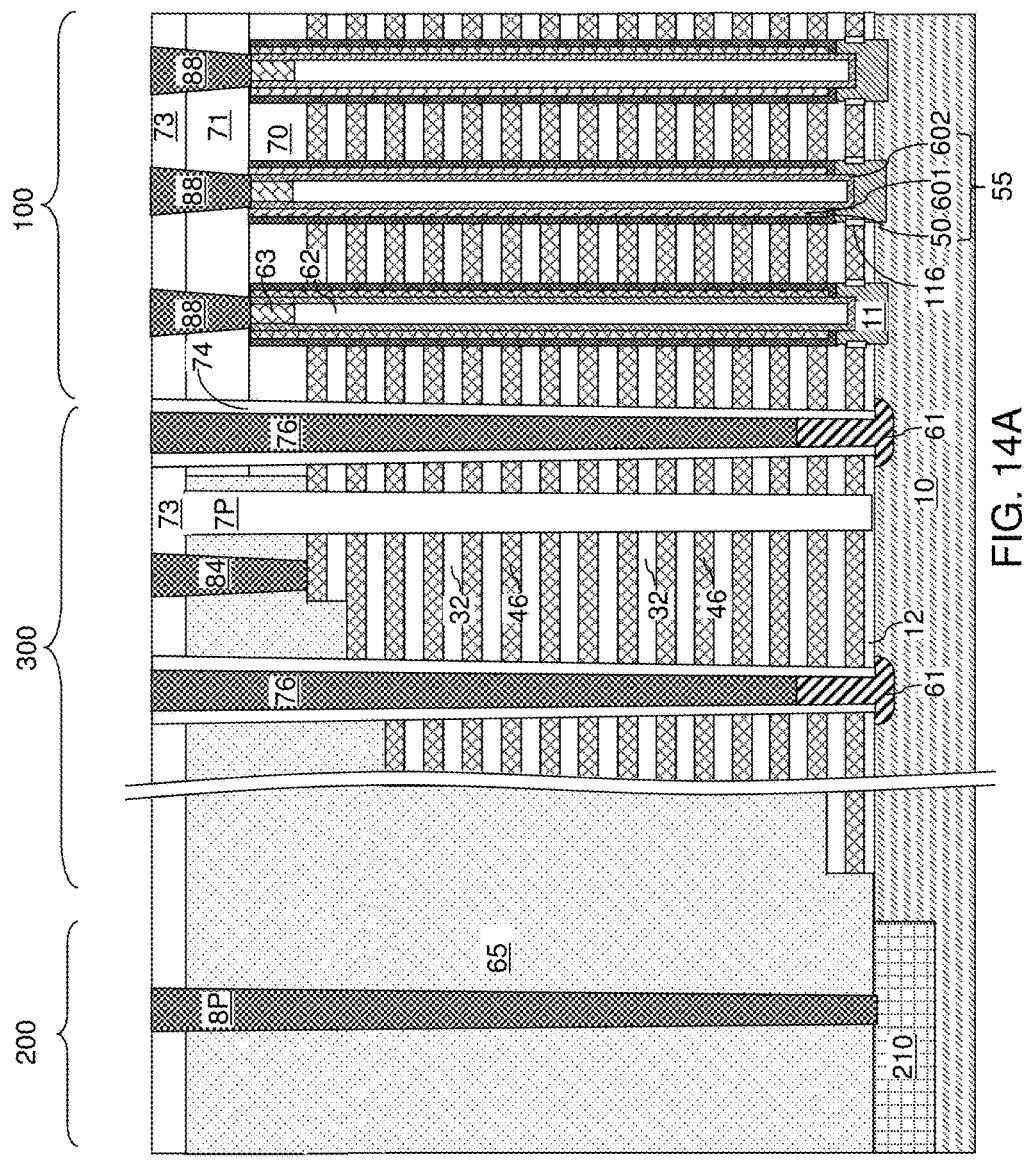
FIG. 14A is a vertical cross-sectional view of the first exemplary structure after formation of various additional contact via structures according to an embodiment of the present disclosure.
Figure 14B:
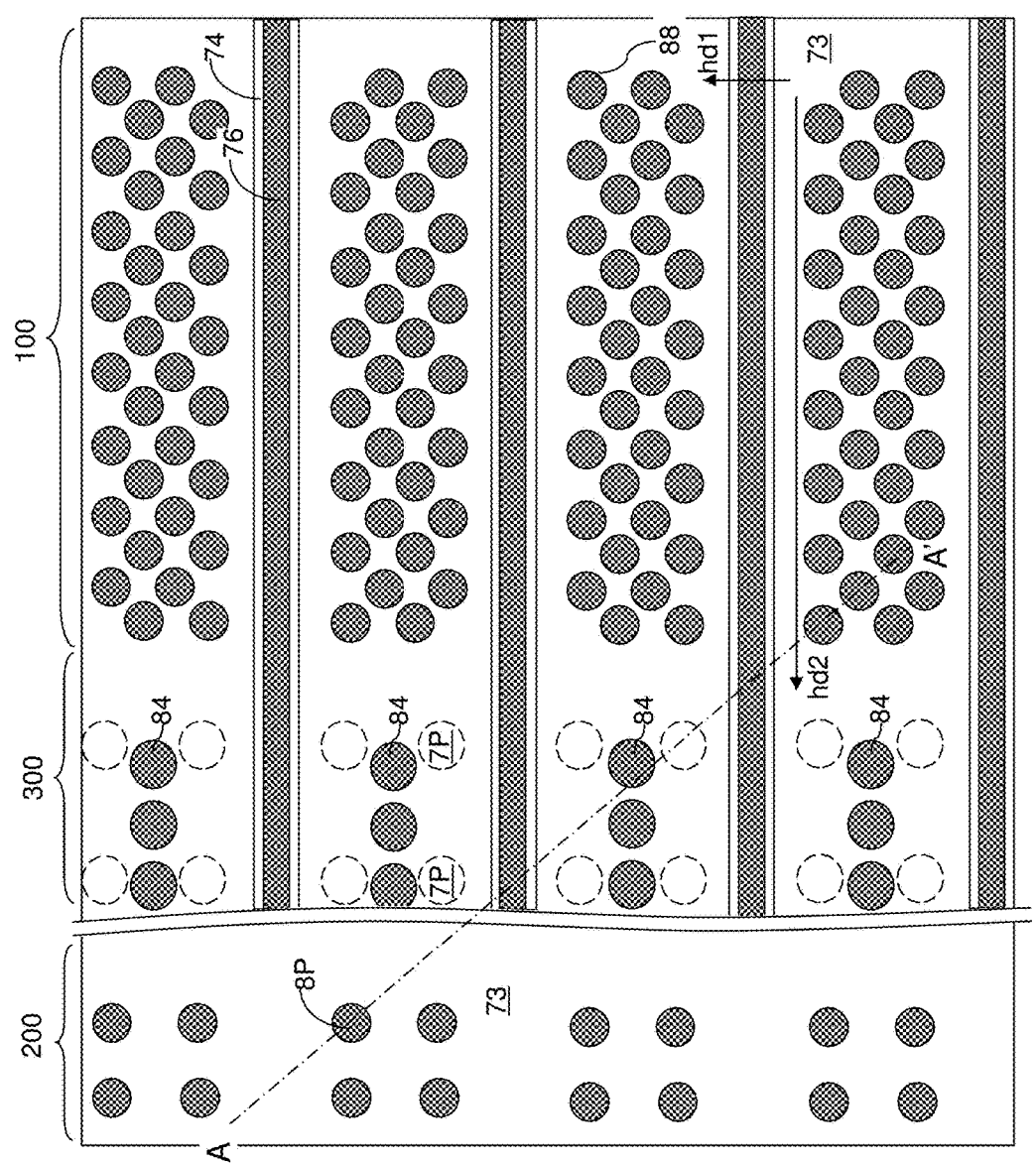
FIG. 14B is a see-through top-down view of the first exemplary structure of FIG. 14A. The vertical plane A-A' is the plane of the vertical cross-sectional view of FIG. 14A.

Referring to FIGS. 14A and 14B, a photoresist layer (not shown) can be applied over the topmost layer of the first exemplary structure (which can be, for example, the at least one contact level dielectric layer (71, 73)), and is lithographically patterned to form various openings in the device region 100, the peripheral device region 200, and the contact region 300. The locations and the shapes of the various openings are selected to correspond to electrical nodes of the various devices to be electrically contacted by contact via structures. In one embodiment, a single photoresist layer may be employed to pattern all openings that correspond to the contact via cavities to be formed, and all contact via cavities can be simultaneously formed by at least one anisotropic etch process that employs the patterned photoresist layer as an etch mask. In another embodiment, a plurality of photoresist layers may be employed in combination with a plurality of anisotropic etch processes to form different sets of contact via cavities with different patterns of openings in the photoresist layers. The photoresist layer(s) can be removed after a respective anisotropic etch process that transfers the pattern of the openings in the respective photoresist layer through the underlying dielectric material layers and to a top surface of a respective electrically conductive structure.

In an illustrative example, drain contact via cavities can be formed over each memory stack structure 55 in the device region 100 such that a top surface of a drain region 63 is physically exposed at the bottom of each drain contact via cavity. Word line contact via cavities can be formed to the stepped surfaces of the alternating stack (32, 46) such that a top surface of an electrically conductive layer 46 is physically exposed at the bottom of each word line contact via cavity in the contact region 300. A device contact via cavity can be formed to each electrical node of the peripheral devices 210 to be contacted by a contact via structure in the peripheral device region.

The various via cavities can be filled with at least one conductive material, which can be a combination of an electrically conductive metallic liner material (such as TiN, TaN, or WN) and a metallic fill material (such as W, Cu, or Al). Excess portions of the at least one conductive material can be removed from above the at least one contact level dielectric layer (71, 73) by a planarization process, which can include, for example, chemical mechanical planarization (CMP) and/or a recess etch. Drain contact via structures 88 can be formed on the respective drain regions 63. Word line contact via structures 84 can be formed on the respective electrically conductive layers 46. Peripheral device contact via structures 8P can be formed on the respective nodes of the peripheral devices 210. Additional metal interconnect structures (not shown) and interlayer dielectric material layers (not) shown can be formed over the first exemplary structure to provide electrical wiring among the various contact via structures.

The first exemplary structure can include a three-dimensional memory device. The three-dimensional memory device can include an alternating stack of insulating layers 32 and electrically conductive layers 46 and located over a substrate 10, and memory stack structures 55 extending through the alternating stack (32, 46). The three-dimensional memory device includes a source region 61 comprising a substrate source portion 61A located in the substrate and an epitaxial pedestal source portion 61B overlying, and in epitaxial alignment, with the substrate (e.g., in substrate semiconductor layer 10) source portion 61A.

A backside trench extends through the alternating stack (32, 46). An insulating spacer 74 is located in the backside trench, and contacts a sidewall surface of the epitaxial pedestal source portion 61B. A bottom surface of the insulating spacer 74 contacts a top surface of the substrate source portion 61A and portion 61A extends under the spacer 74 to overlap the bottom of the select gate electrode 46S. However, portion 61A does not extend to the corner of the select gate electrode 46S adjacent to the memory stack structures 55, such that a channel of the first conductivity type is located under the corner of the select gate electrode 46S adjacent to layer 116. A horizontal interface 59C between the epitaxial pedestal source portion 61B and the substrate source portion 61A can be coplanar with a bottom surface of the insulating spacer 74. In one embodiment, the horizontal interface 59C between the epitaxial pedestal source portion 61B and the substrate source portion 61A can be located within a plane located at or below a topmost surface of the substrate that includes the substrate semiconductor layer 10.

In one embodiment, the epitaxial pedestal source portion 61B can have the same or different semiconductor composition than the semiconductor composition of the substrate source portion 61A. A backside contact via structure 76 can be laterally surrounded by the insulating spacer 74, and can contact the source region 61. In one embodiment, the backside contact via structure 76 can comprise a metallic liner that contacts a top surface of the epitaxial pedestal source portion 61B. In one embodiment, the top surface of the epitaxial pedestal source portion 61B can be located above the horizontal plane including the bottom surface of the bottommost electrically conductive layer 46S (e.g., the select gate electrode) within the alternating stack (32, 46). In another embodiment, the top surface of the epitaxial pedestal source portion 61B can be located even with or below the horizontal plane including the bottom surface of the bottommost electrically conductive layer 46S (e.g., the select gate electrode).

The epitaxial channel portions 11 can contact the substrate 10. Each epitaxial channel portion 11 can underlie a respective memory stack structure 55. In one embodiment, the epitaxial channel portions 11 can have the same semiconductor composition as the epitaxial pedestal source portion 61B but a different conductivity type. In another embodiment, the epitaxial channel portions 11 can have a different semiconductor composition from the epitaxial pedestal source portion 61B. A p-n junction is located between the source region 61 and a doped semiconductor channel portion HC within the substrate (e.g., in substrate semiconductor layer 10). The p-n junction can be spatially (i.e., vertically and/or horizontally) offset from an interface between the substrate source portion 61A and the epitaxial pedestal source portion 61B.

Figure 15A:
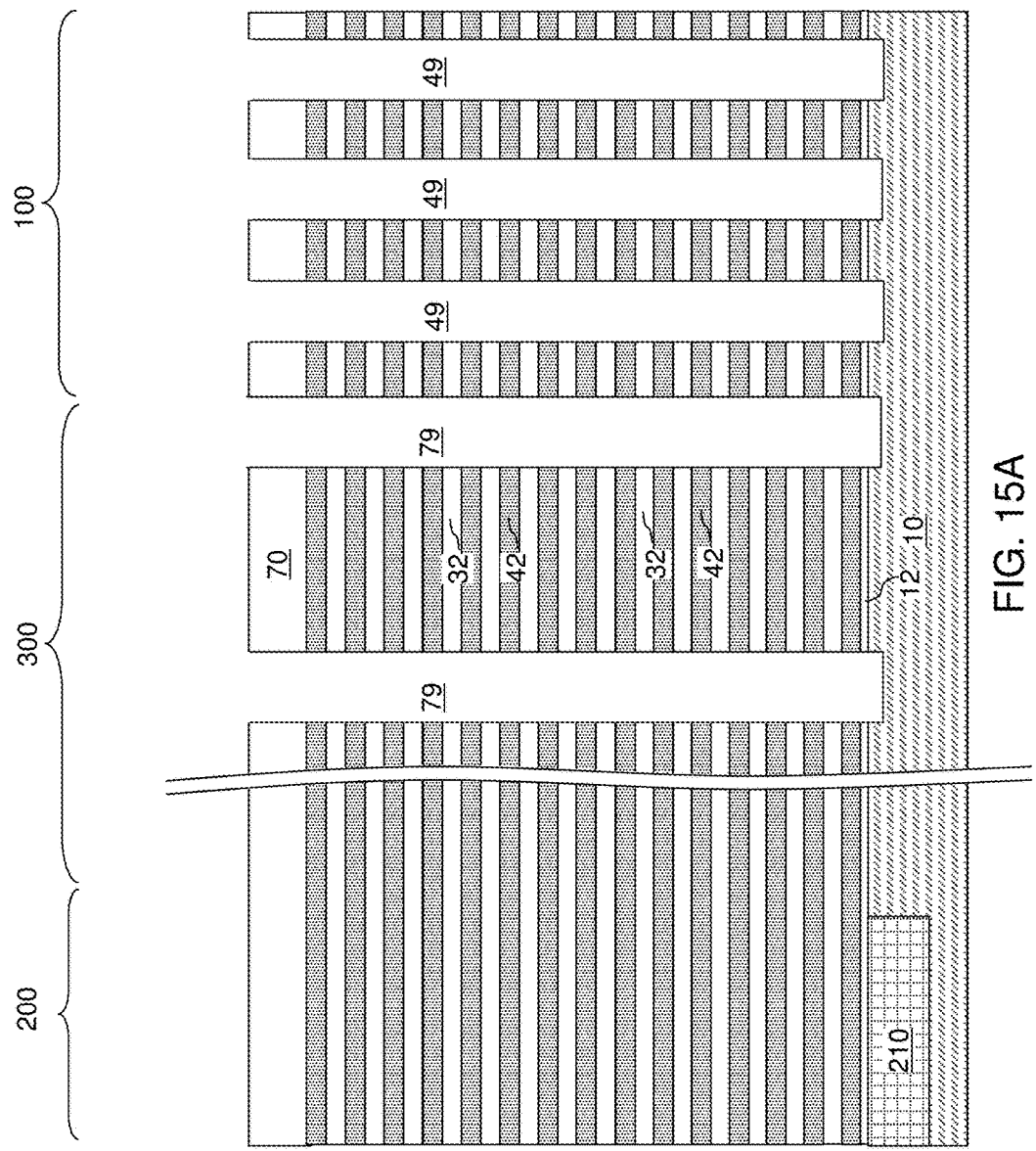
FIG. 15A is a vertical cross-sectional view of a second exemplary structure after formation of memory openings and backside trenches according to a second embodiment of the present disclosure.
Figure 15B:
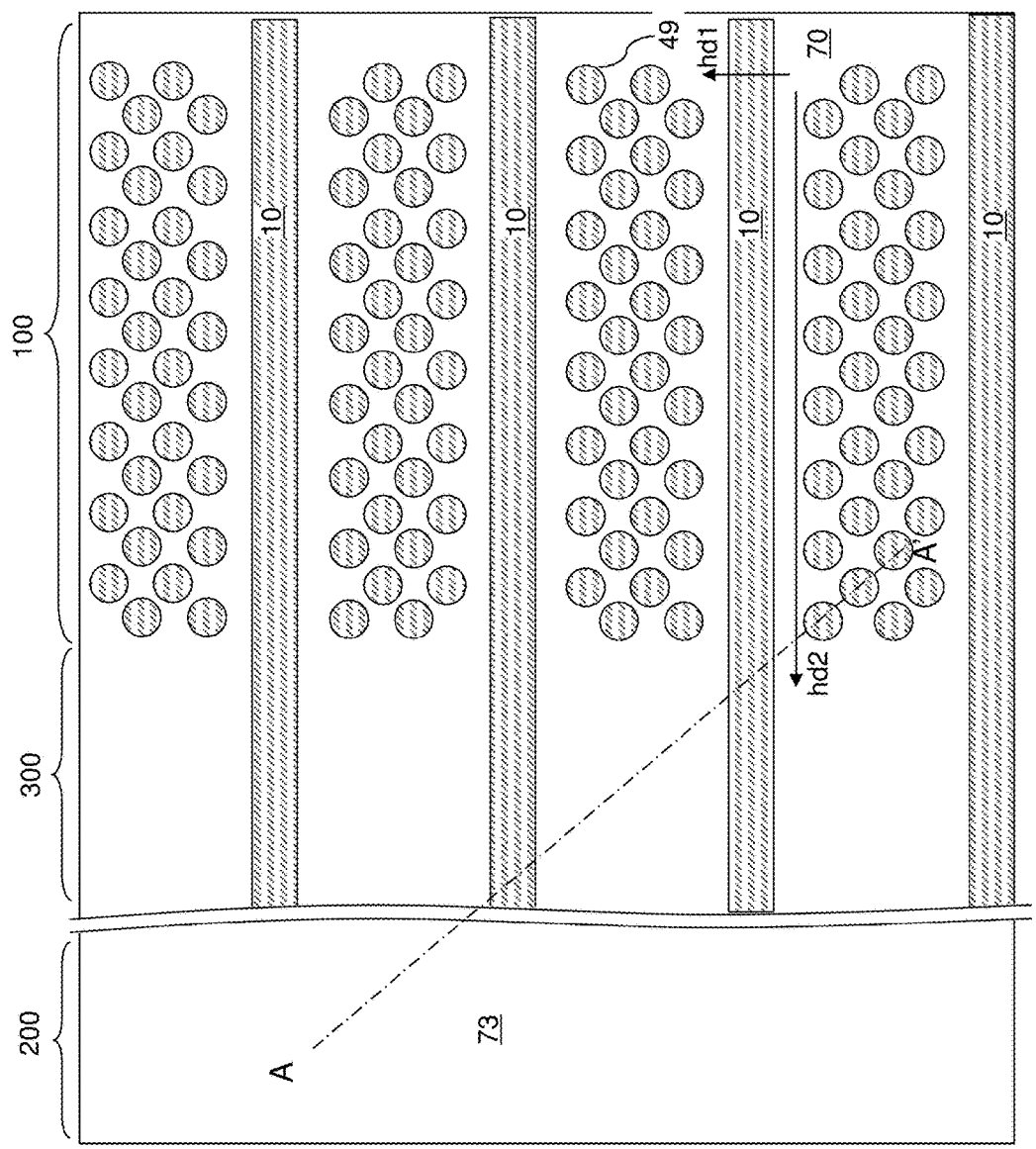
FIG. 15B is a see-through top-down view of the exemplary structure of FIG. 15A. The vertical plane A-A' is the plane of the vertical cross-sectional view of FIG. 15A.

Referring to FIGS. 15A and 15B, a second exemplary structure can be derived from an in-process exemplary structure of FIGS. 6A and 6B. FIGS. 15A and 15B illustrate the structure of the second embodiment after formation of the insulating cap layer 70 by forming memory openings 49 and backside trenches 79 through the alternating stack (32, 42). In the second embodiment, the epitaxial pedestal structure is formed at the same time as the epitaxial channel structures and prior to forming the gate electrodes 46, 46S and the insulating spacer 74. In the second embodiment, the memory openings 49 and the backside trenches 79 can be formed simultaneously employing a same lithographic patterning process and an anisotropic etch. Both the memory openings 49 and the backside trenches 79 may be recessed into the substrate semiconductor layer 10. In this case, the backside trenches 79 and the memory openings 49 can be formed during the same anisotropic etch process. A top surface of the single crystalline semiconductor material portion in the substrate semiconductor layer 10 is physically exposed at the bottom of each backside trench 79. In another embodiment, the memory openings 49 and the backside trenches 79 can be formed in different processing steps, each employing a combination of a lithographic patterning step and an anisotropic etch. In this case, formation of the backside trenches 79 can be performed prior to, or after, formation of the memory openings 49.

Figure 16:
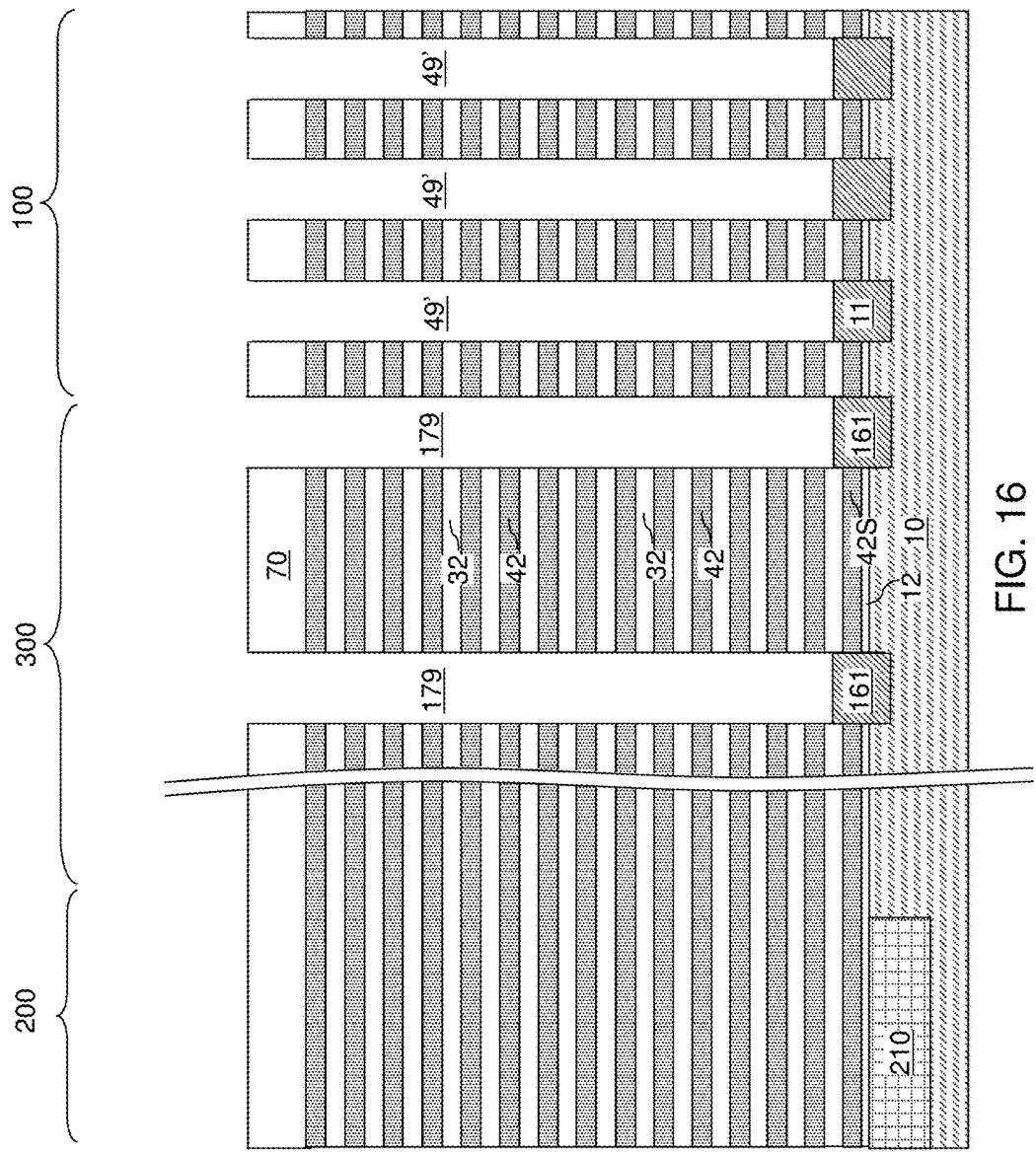
FIG. 16 is a vertical cross-sectional view of the second exemplary structure after formation of epitaxial channel portions and epitaxial pillar structures according to the second embodiment of the present disclosure.

Referring to FIG. 16, a selective epitaxy process can be performed to form epitaxial channel portions 11 and epitaxial pillar structures 161 in the same growth step. The epitaxial channel portions 11 may be taller than the epitaxial pillar structures 161 if the memory openings have a narrower width than the backside trenches 79. Each epitaxial channel portion 11 is formed at the bottom of a memory opening 49. A memory cavity 49' is present above each epitaxial channel portion 11. Each epitaxial pedestal structure 161 is formed at the bottom of a backside trench 79. A backside cavity 179 is present above each epitaxial pedestal structure 161. Each epitaxial pedestal structure 161 has the same composition as the epitaxial channel portions 11.

The selective epitaxy process that is employed to form the epitaxial channel portions 11 and epitaxial pillar structures 161 can be the same as the selective epitaxy process employed to form the epitaxial channel portions 11 of the first embodiment. Thus, the composition of the epitaxial channel portions 11 and the epitaxial pedestal structures 161 can be the same as the composition of the epitaxial channel portions 11 of the first embodiment. Thus, the epitaxial channel portions 11 and the epitaxial pedestal structures 161 as formed can be undoped, or can have a light doping of the first conductivity type (e.g., at a dopant concentration of about $1.0 \times 10^{16}/cm^3 \sim 1.0 \times 10^{17}/cm^3$, although greater and lesser concentrations can also be employed). The duration of the selective epitaxy process can be selected such that the topmost surfaces of the epitaxial channel portions 11 are formed at the level of an insulating layer 32 that is located directly on the topmost sacrificial material layer to be replaced with source side select gate electrodes and below sacrificial material layers to be replaced with control gate electrodes. Each of the epitaxial pedestal structures 161 and the epitaxial channel portions 11 can be formed on a top surface of, an in epitaxial alignment with, the single crystalline semiconductor material portion within the substrate semiconductor layer 10 that is the uppermost portion of the substrate.

Figure 17:
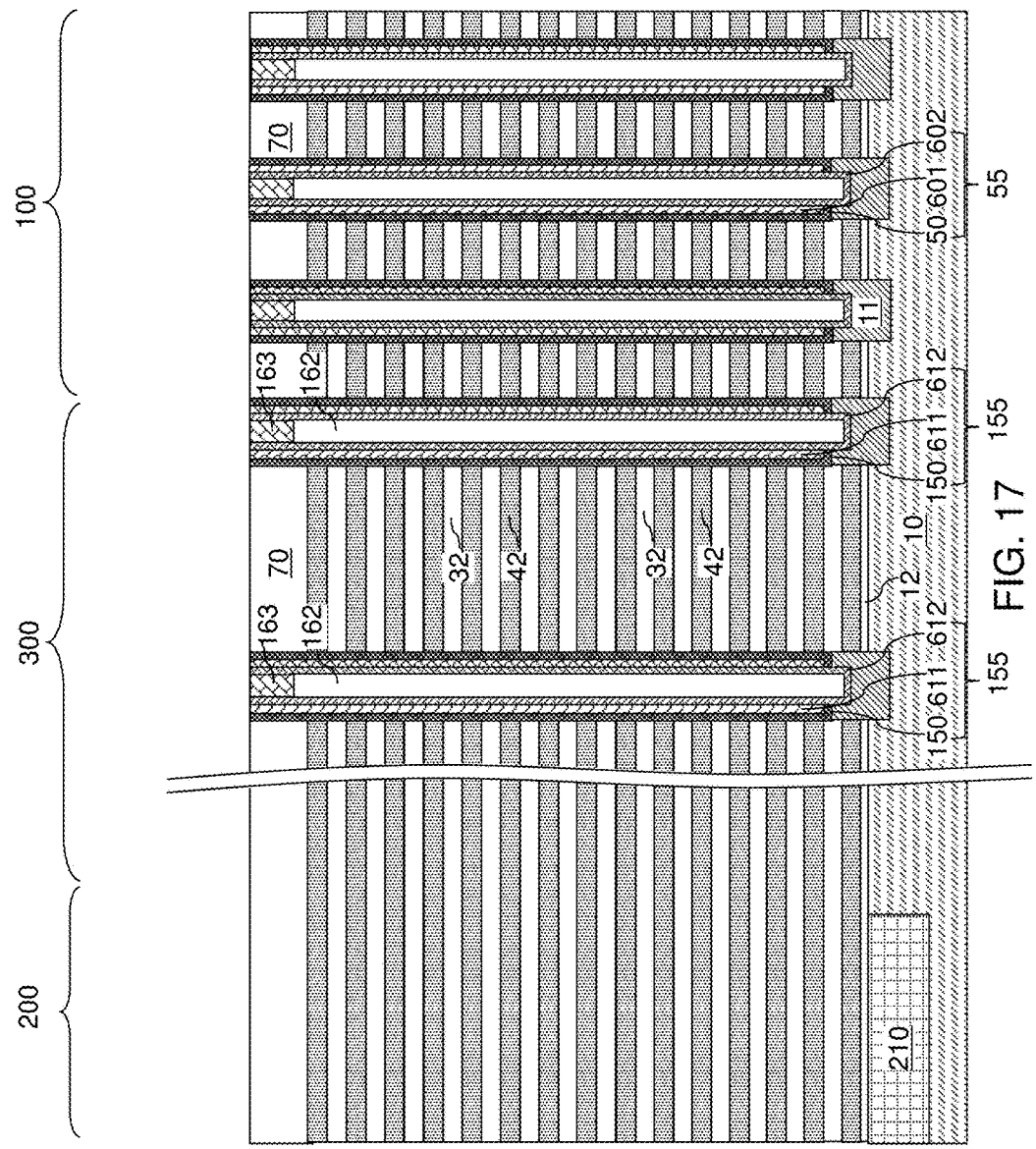
FIG. 17 is a vertical cross-sectional view of the second exemplary structure after formation of memory stack structures and dummy trench fill structures according to the second embodiment of the present disclosure.

Referring to FIG. 17, the processing steps of FIGS. 2C-2H are performed to form a memory stack structure 55 within each memory cavity 49'. Each memory stack structure 55 is formed over a respective epitaxial channel portion 11. A dummy trench fill structure 155 is collaterally formed within each backside cavity 179 concurrently with formation of the memory stack structures 55. Each component within the dummy trench fill structures 155 comprises the same material as a respective corresponding component within one of the memory stack structures 55. For example, each dummy trench fill structure 155 can include a dummy memory film 150 having the same composition and thickness as a memory film 50 in a memory stack structure 55, a first dummy semiconductor channel 611 having the same composition and thickness as a first semiconductor channel 601 in a memory stack structure 55, and a second dummy semiconductor channel 612 having the same composition and thickness as a second semiconductor channel 602 in a memory stack structure 55. Further, a dummy dielectric core 162 within each backside trench can have the same composition as a dielectric core 62 in a memory opening, and each dummy drain region 163 overlying a dummy dielectric core 162 can have the same composition as a drain region 63 in a memory opening.

Figure 18:
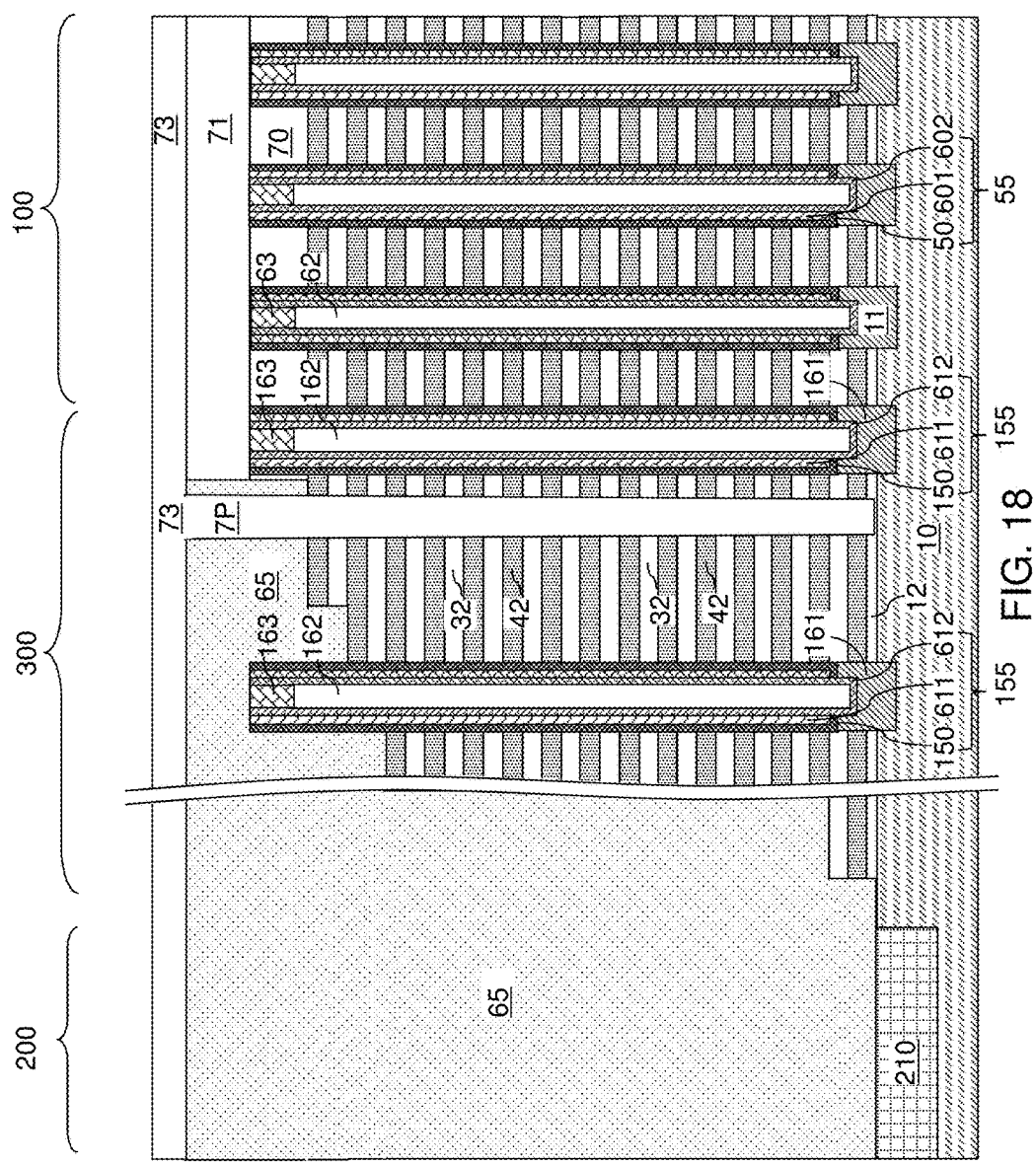
FIG. 18 is a vertical cross-sectional view of the second exemplary structure after formation of stepped surfaces, a retro-stepped dielectric material portion, and a second contact level dielectric layer according to the second embodiment of the present disclosure.

Referring to FIG. 18, processing steps of FIGS. 4 and 5 can be performed to form a retro-stepped dielectric material portion 65, at least one contact level dielectric layer (71, 73) and dielectric support pillars 7P.

Figure 19:
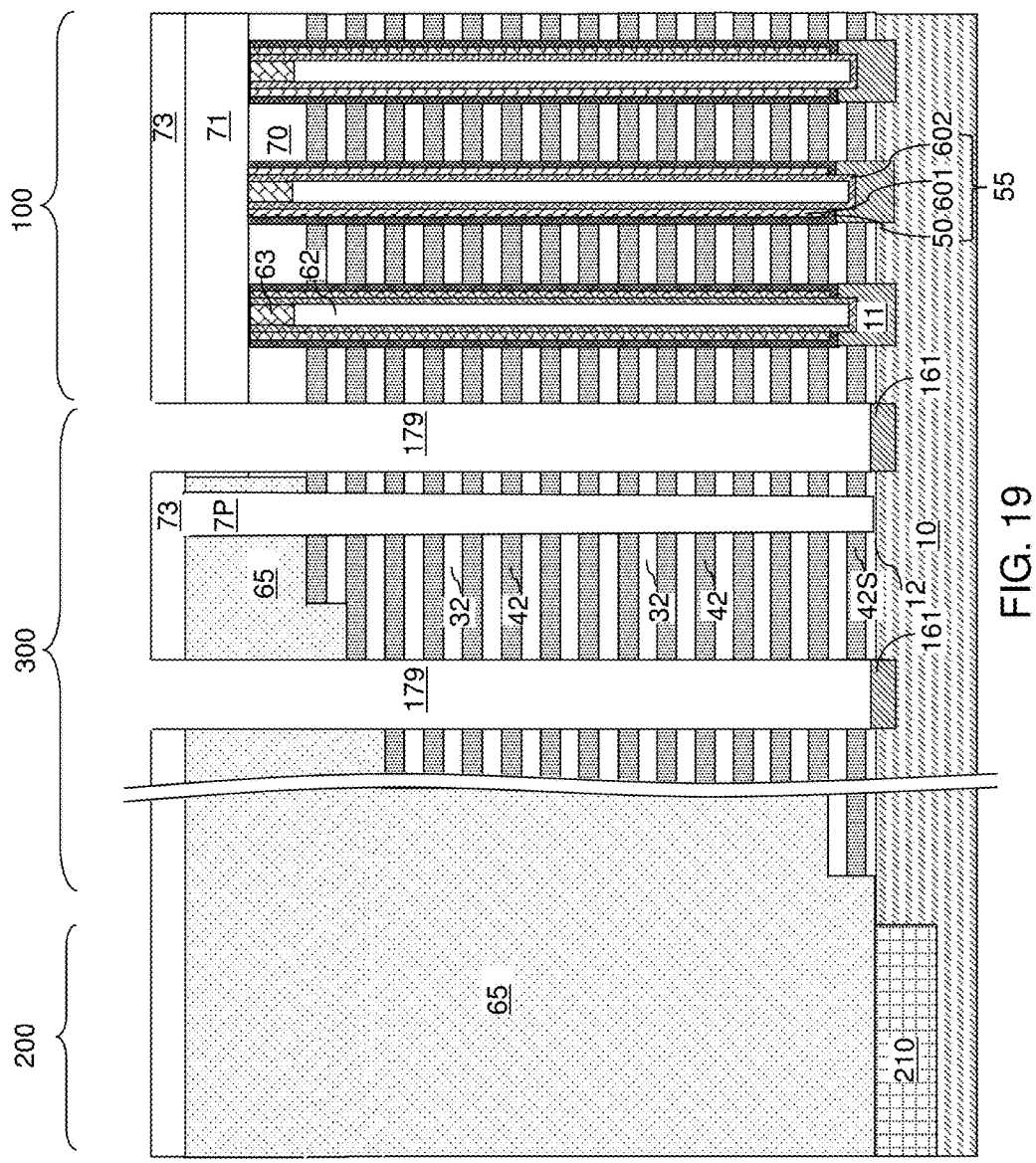
FIG. 19 is a vertical cross-sectional view of the second exemplary structure after removal of the dummy trench fill structures and optional recessing of the epitaxial pillar structures according to the second embodiment of the present disclosure.

Referring to FIG. 19, openings can be formed above each dummy trench fill structure 155, for example, by applying a photoresist layer over the second exemplary structure, patterning the photoresist layer to form openings overlying the dummy trench fill structures 155, and anisotropically etching the portions of the at least one contact level dielectric layer (71, 73) overlying the dummy trench fill structures 155. Subsequently, the dummy trench fill structures 155 can be removed by a combination of etch processes (which may include at least one anisotropic etch process and/or at least one isotropic etch process) selective to the epitaxial pedestal structures 161. The photoresist layer may be collaterally removed during one of the etch processes, or can be removed after the anisotropic etch that physically exposes top surfaces of the dummy trench fill structures 155. A backside cavity 179 is formed within each backside trench. A top surface of each epitaxial pedestal structure 161 is physically exposed at the bottom of each backside trench 179.

Subsequently, the top surfaces of the epitaxial pedestal structures 161 can be recessed below the horizontal plane including the bottom surface of the bottommost sacrificial material layer 42S. The recessing of the top surfaces of the epitaxial pedestal structures 161 can be performed by an isotropic etch or an anisotropic etch.

Figure 20:
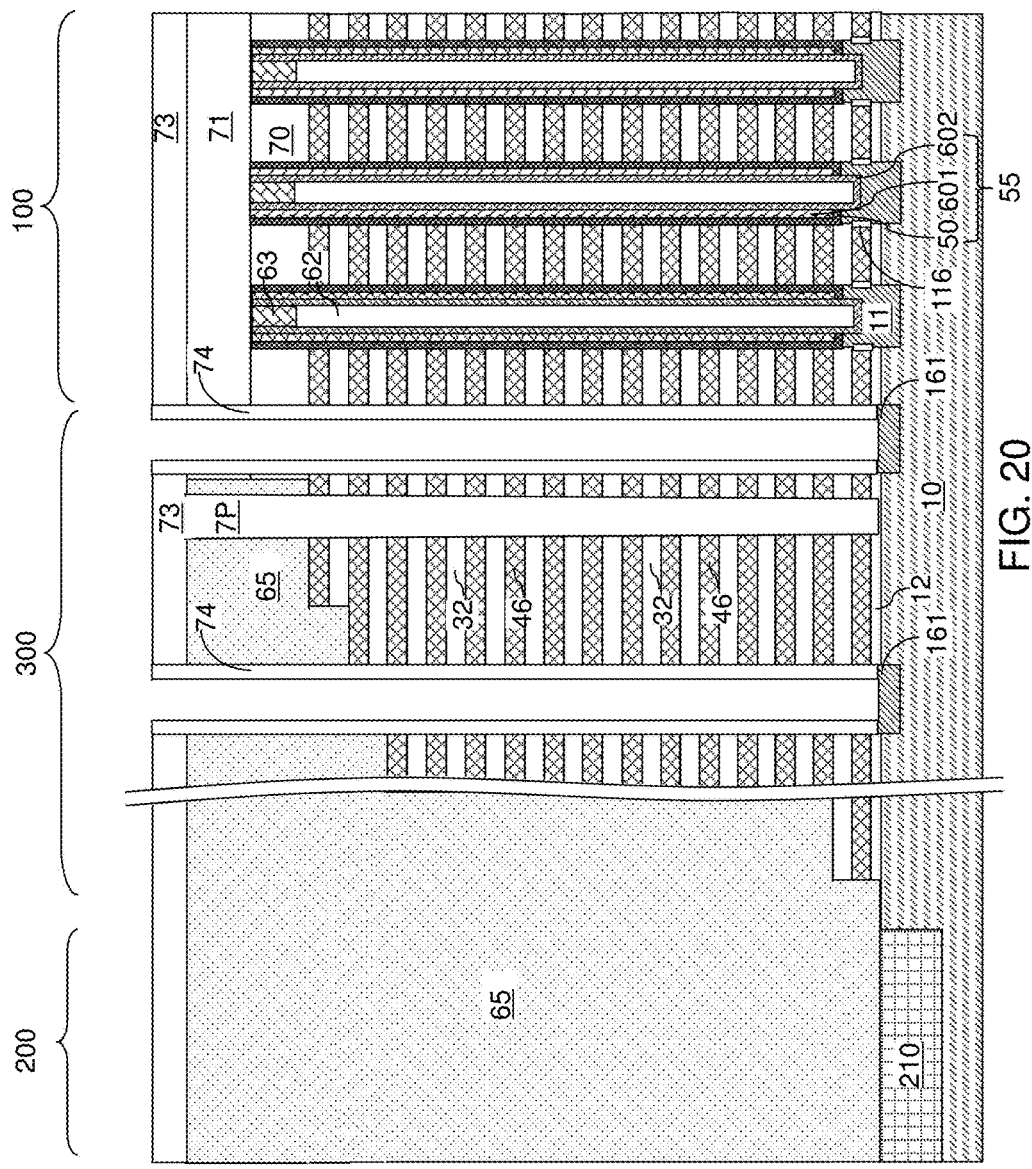
FIG. 20 is a vertical cross-sectional view of the second exemplary structure after formation of insulating spacers according to the second embodiment of the present disclosure.

Referring to FIG. 20, the processing steps of FIGS. 7 to 10 can be performed to replace layers 42, 42S with gate electrodes 46, 46S and to form an insulating spacer 74 within each backside trench 79. A bottommost surface of each insulating spacer 74 is formed on a top surface of an epitaxial pedestal structure 161 within a backside trench 79.

Figure 21:
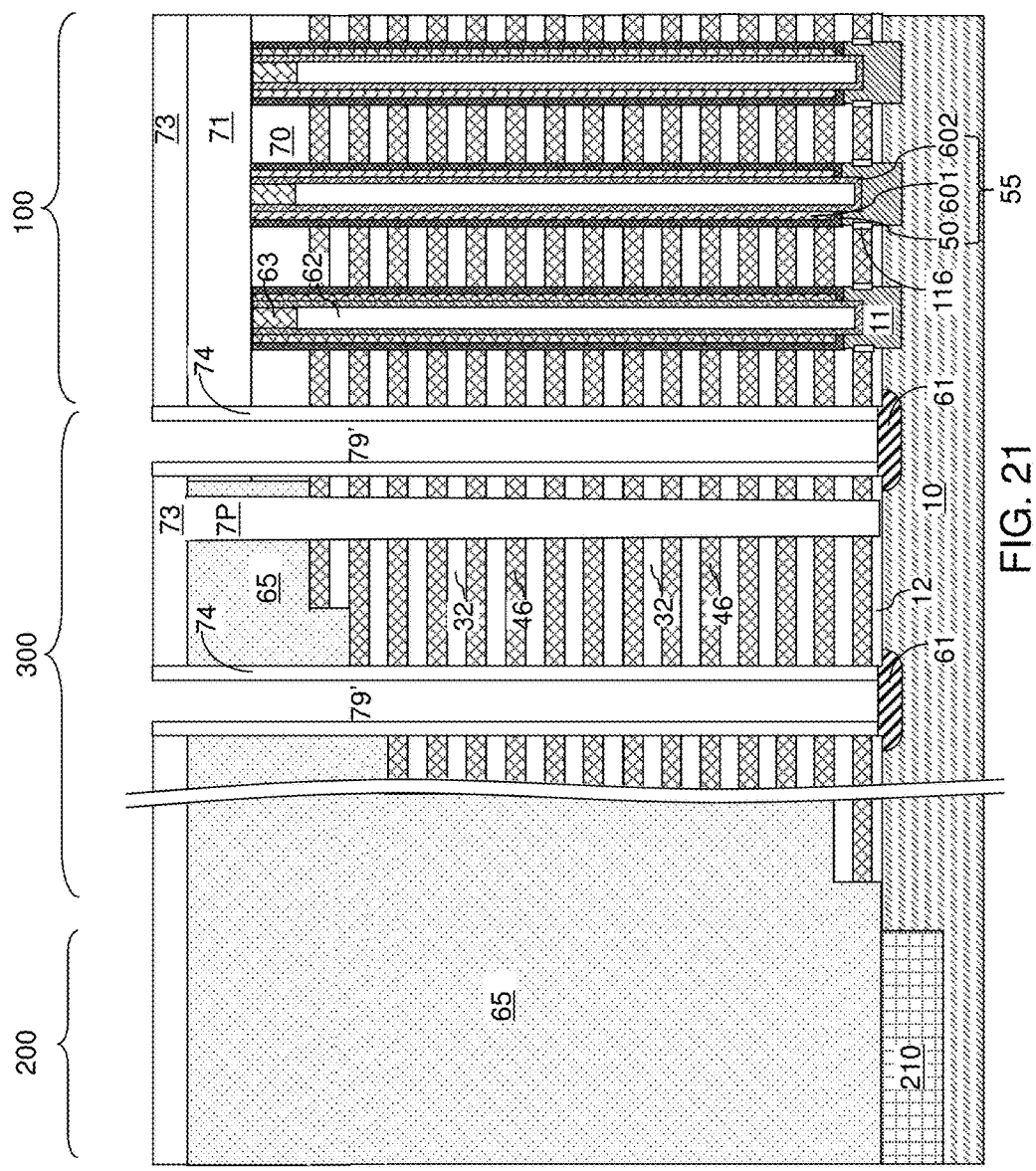
FIG. 21 is a vertical cross-sectional view of the second exemplary structure after formation of source regions according to the second embodiment of the present disclosure.

Referring to FIG. 21, dopants of the second conductivity type are implanted into each epitaxial pedestal structure 161 and optionally into underlying single crystalline semiconductor material portion of the substrate semiconductor layer 10 by ion implantation. Underneath each backside trench 79', a source region 61 is formed by doping the epitaxial pedestal structure 161 and a surface region of a single crystalline semiconductor material portion (of the substrate semiconductor layer 10) that underlies the epitaxial pedestal structure 161 with the implanted electrical dopants of the second conductivity type.

Figure 22A:
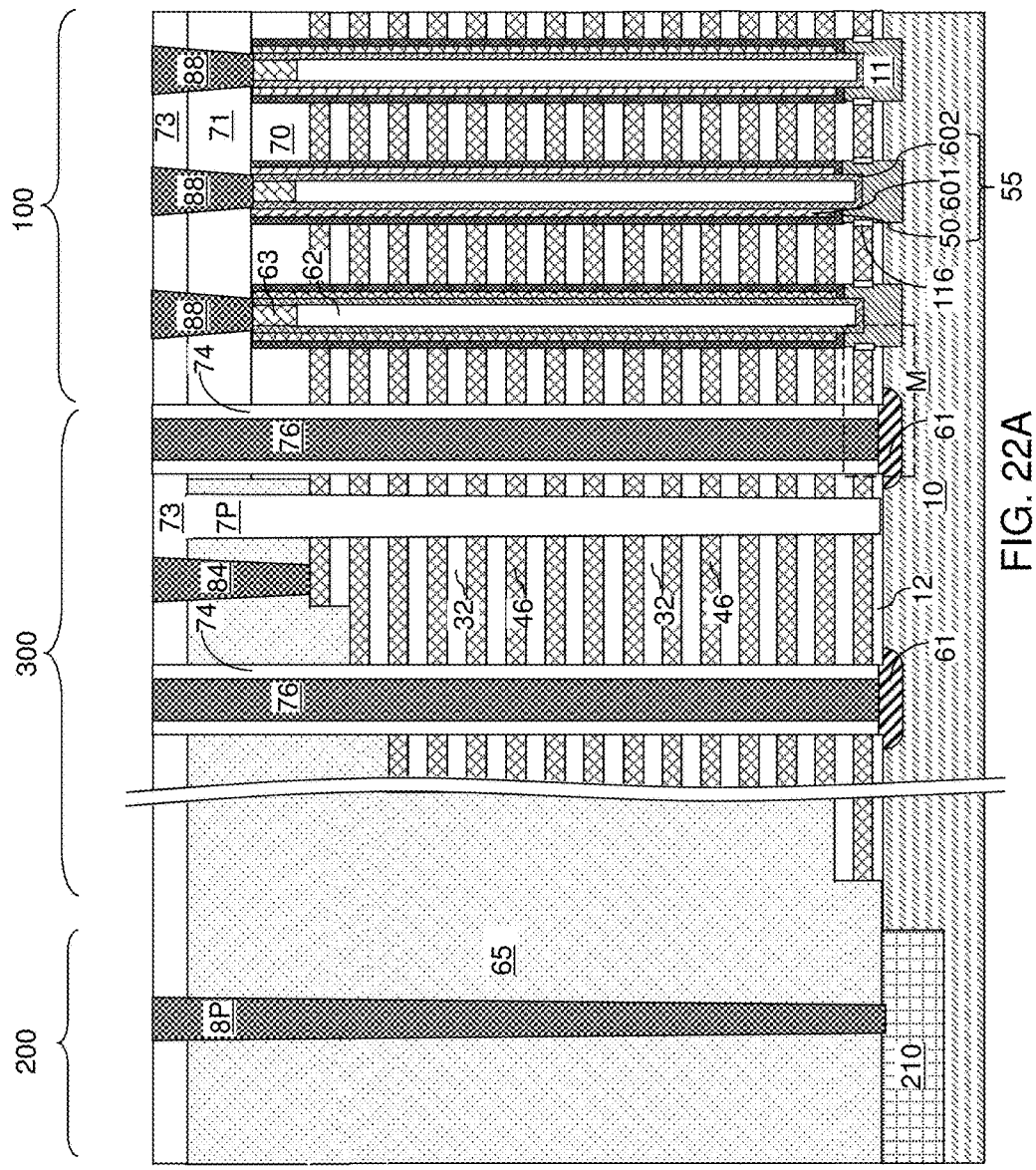
FIG. 22A is a vertical cross-sectional view of the second exemplary structure after formation of backside contact via structures and additional contact via structures according to the second embodiment of the present disclosure.
Figure 22B:
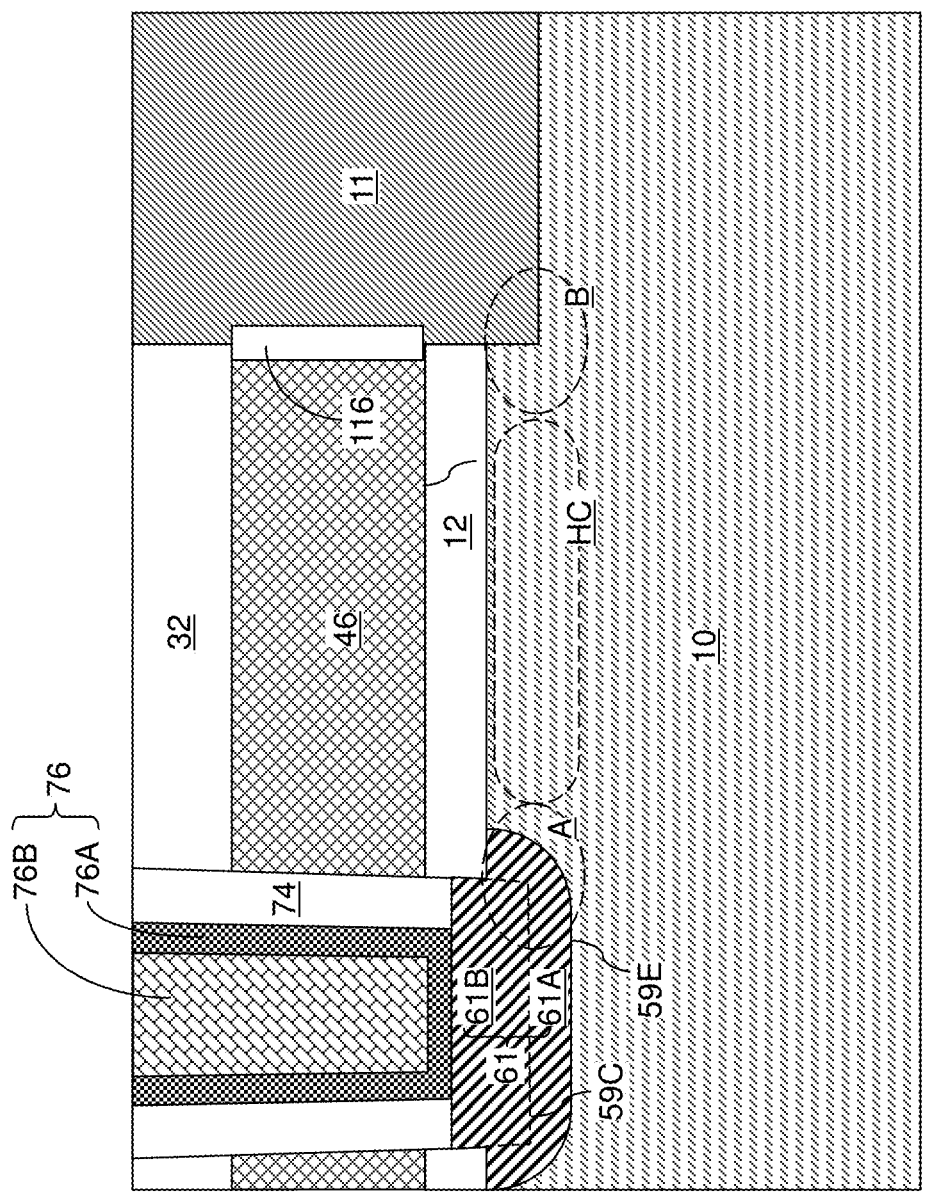
FIG. 22B is a vertical cross-sectional view of a magnification region M in FIG. 22A.

Referring to FIGS. 22A and 22B, the processing steps of FIGS. 13, 14A, and 14B can be performed to form backside contact via structures 76 comprising the metallic liner/barrier (e.g., TiN or WN) layer 76A and the metallic fill (e.g., tungsten) layer 76B and various additional contact via structures (88, 84, 8P).

Each source region 61 comprises a substrate source portion 61A located in the substrate (e.g., in the substrate semiconductor layer 10) and an epitaxial pedestal source portion 61B overlying, and in epitaxial alignment, with the substrate source portion 61A. The substrate source portion 61A has the same semiconductor composition but opposite conductivity type (e.g., n-type single crystal silicon doped with phosphorus or arsenic) from the remaining portion of the substrate semiconductor layer 10, i.e., the portion of the substrate semiconductor layer 10 that has a doping of the first conductivity type (e.g., p-type single crystal silicon doped with boron). Particularly, the substrate source portion 61A is in epitaxial alignment with a horizontal channel portion HC, which is a portion of the channel of a field effect transistor including a drain region 63, a semiconductor channel (601, 602) underlying and contacting the drain region 63, an epitaxial channel portion 11 in contact with the semiconductor channel (601, 602), the horizontal channel portion HC in contact with the epitaxial channel portion 11, and the source region 61 in contact with the horizontal channel portion HC. The combination of the horizontal channel portion HC, the epitaxial channel portion 11, and the semiconductor channel (601, 602) collectively constitute the channel of the field effect transistor. Each source region 61 is epitaxially aligned to the single crystalline structure of an adjacent horizontal channel portion HC. Further, each epitaxial channel portion 11 is epitaxially aligned to an adjacent horizontal channel portion HC. A p-n junction 59E between the source region 61 and the substrate semiconductor layer 10 can be vertically offset from the interface 59C between the substrate source portion 61A and the epitaxial pedestal source portion 61B.

The second exemplary structure can include a three-dimensional memory device. The three-dimensional memory device can include an alternating stack of insulating layers 32 and electrically conductive layers 46 and located over a substrate 10, and memory stack structures 55 extending through the alternating stack (32, 46). The three-dimensional memory device includes a source region 61 comprising a substrate source portion 61A located in the substrate and an epitaxial pedestal source portion 61B overlying, and in epitaxial alignment, with the substrate source portion 61A.

A backside trench extends through the alternating stack (32, 46). An insulating spacer 74 is located in the backside trench, and contacts a sidewall surface of the epitaxial pedestal source portion 61B. A bottom surface of the insulating spacer 74 contacts a surface of the substrate source portion 61A. A horizontal interface 59C between the epitaxial pedestal source portion 61B and the substrate source portion 61A can be coplanar with a bottom surface of the insulating spacer 74. In one embodiment, the horizontal interface between the epitaxial pedestal source portion 61B and the substrate source portion 61A can be located within a plane located below a topmost surface of the substrate that includes the substrate semiconductor layer 10.

In one embodiment, the epitaxial pedestal source portion 61B can have the same or different semiconductor composition than the semiconductor composition of the substrate source portion 61A. A backside contact via structure 76 can be laterally surrounded by the insulating spacer 74, and can contact the source region 61. In one embodiment, the backside contact via structure 76 can comprises a metallic liner that contacts a top surface of the epitaxial pedestal source portion 61B. In one embodiment, the top surface of the epitaxial pedestal source portion 61B can be located below the horizontal plane including the bottom surface of the bottommost electrically conductive layer 46S (e.g., source side select gate electrode) within the alternating stack (32, 46).

The epitaxial channel portions 11 can contact the substrate 10. Each epitaxial channel portion 11 can underlie a respective memory stack structure 55. In one embodiment, the epitaxial channel portions 11 can have the same semiconductor composition (e.g., p-type or intrinsic single crystal silicon) but an opposite conductivity type from the epitaxial pedestal source portion 61B (e.g., n-type single crystal silicon). In one embodiment, the epitaxial channel portions 11 can have a different semiconductor composition from the epitaxial pedestal source portion 61B. A p-n junction is located between the source region 61 and a doped semiconductor channel portion HC within the substrate (e.g., within the substrate semiconductor layer 10). The p-n junction can be spatially offset from an interface between the substrate source portion 61A and the epitaxial pedestal source portion 61B.

In one embodiment, the device in the first or second exemplary structure can include a vertical NAND device located in the device region 100, and at least one of the electrically conductive layers 46, 46S in the stack (32, 46) can comprise, or can be electrically connected to, a word line and a source side select gate electrode, respectively, of the NAND device. A drain side select gate electrode may be located at the top of the stack. The device region 100 can include a plurality of semiconductor channels (601, 602). At least one end portion of each of the plurality of semiconductor channels (601, 602) extends substantially perpendicular to a top surface of the semiconductor substrate. The device region 100 further includes a plurality of charge storage regions located within each memory layer 50. Each charge storage region is located adjacent to a respective one of the plurality of semiconductor channels (601, 602). The device region 100 further includes a plurality of control gate electrodes having a strip shape extending substantially parallel to the top surface of the substrate (e.g., of the substrate semiconductor layer 10). The plurality of control gate electrodes comprise at least a first control gate electrode located in the first device level and a second control gate electrode located in the second device level. The plurality of electrically conductive layers 46 in the stack (32, 46) can be in electrical contact with, or can comprise, the plurality of control gate electrodes, and extends from the device region 100 to a contact region 300 including a plurality of electrically conductive contact via structures.

In case the first or second exemplary structure includes a three-dimensional NAND device, a stack (32, 46) of an alternating plurality of word lines 46 and insulating layers 32 can be located over a semiconductor substrate. Each of the word lines 46 and insulating layers 32 is located at different levels that are vertically spaced from a top surface of the semiconductor substrate by different distances. An array of memory stack structures 55 is embedded within the stack (32, 46). Each memory stack structure 55 comprises a semiconductor channel (601, 602) and at least one charge storage region located adjacent to the semiconductor channel (601, 602). At least one end portion of the semiconductor channel (601, 602) extends substantially perpendicular to the top surface of the semiconductor substrate through the stack (32, 46).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
    an alternating stack of insulating layers and electrically conductive layers and located over a substrate;
    memory stack structures extending through the alternating stack;
    a source region comprising a substrate source portion located in the substrate and an epitaxial pedestal source portion directly contacting a top surface of, and in epitaxial alignment with, the substrate source portion; and
    a source contact via structure directly contacting a top surface of the epitaxial pedestal source portion, wherein a sidewall of the epitaxial pedestal source portion forms a straight line with a sidewall of the source contact via structure.

2. The three-dimensional memory device of claim 1, further comprising:
    a backside trench extending through the alternating stack; and
    an insulating spacer located in the backside trench and directly contacting the sidewall of the epitaxial pedestal source portion,
    wherein the source contact via structure is laterally surrounded by the insulating spacer.

3. The three-dimensional memory device of claim 2, wherein a bottom surface of the insulating spacer directly contacts a surface of the substrate source portion.

4. The three-dimensional memory device of claim 2, wherein a horizontal interface between the epitaxial pedestal source portion and the substrate source portion is coplanar with a bottom surface of the insulating spacer.

5. The three-dimensional memory device of claim 2, wherein the epitaxial pedestal source portion comprises single crystal silicon and the substrate comprises a single crystal silicon wafer or a single crystal silicon layer containing the substrate source portion.

6. The three-dimensional memory device of claim 2, wherein:
    a p-n junction between the source region and a doped semiconductor channel portion within the substrate is spatially offset from an interface between the substrate source portion and the epitaxial pedestal source portion;
    a bottom surface of the insulating spacer contacts a top surface of the substrate source portion;
    the substrate source portion extends under the insulating spacer to overlap in area, in a view along a direction perpendicular to a top surface of the substrate, a bottom of a source side select gate electrode in the alternating stack; and
    the substrate source portion does not extend to a corner of the source side select gate electrode adjacent to the memory stack structure.

7. The three-dimensional memory device of claim 1, wherein a top surface of the epitaxial pedestal source portion is located above or below a source side select gate electrode in the alternating stack.

8. The three-dimensional memory device of claim 1, further comprising epitaxial channel portions contacting the substrate and underlying a respective memory stack structure and having a same semiconductor composition as the epitaxial pedestal source portion.

9. The three-dimensional memory device of claim 1, wherein each of the memory stack structures comprises, from inside to outside:

a semiconductor channel;
a tunneling dielectric layer laterally surrounding the semiconductor channel; and
charge storage regions laterally surrounding the tunneling dielectric layer.

10. The three-dimensional memory device of claim 1, wherein:
the three-dimensional memory device comprises a vertical NAND device formed in a device region;
the device region comprises:
a plurality of semiconductor channels, wherein at least one end portion of each of the plurality of semiconductor channels extends substantially perpendicular to a top surface of the substrate;
a plurality of charge storage regions, each charge storage region located adjacent to a respective one of the plurality of semiconductor channels; and
a plurality of control gate electrodes that are embodied as portions of the electrically conductive layers and have a respective strip shape extending substantially parallel to the top surface of the substrate;
the plurality of control gate electrodes comprise at least a first control gate electrode located in a first device level and a second control gate electrode located in a second device level; and
the electrically conductive layers in the stack extend from the device region to a contact region including a plurality of electrically conductive via connections; and
the substrate comprises a silicon substrate containing a driver circuit for the NAND device.

11. The three-dimensional memory device of claim 2, wherein the insulating spacer directly contacts the sidewall of the source contact via structure.

12. The three-dimensional memory device of claim 2, wherein the insulating spacer has a uniform thickness along a vertical direction.

13. A three-dimensional memory device comprising:
an alternating stack of insulating layers and electrically conductive layers and located over a substrate;
memory stack structures extending through the alternating stack;
a source region comprising a substrate source portion located in the substrate and an epitaxial pedestal source portion directly contacting a top surface of, and in epitaxial alignment with, the substrate source portion;
a backside trench extending through the alternating stack; and
a source contact via structure located in the backside trench and directly contacting a top surface of the epitaxial pedestal source portion and laterally surrounded by an insulating spacer located in the backside trench, wherein a sidewall of the epitaxial pedestal source portion forms a straight line with a sidewall of the source contact via structure.

14. The three-dimensional memory device of claim 13, wherein the epitaxial pedestal source portion comprises single crystal silicon and the substrate comprises a single crystal silicon wafer or a single crystal silicon layer containing the substrate source portion.

15. The three-dimensional memory device of claim 13, wherein:
a p-n junction between the source region and a doped semiconductor channel portion within the substrate is spatially offset from an interface between the substrate source portion and the epitaxial pedestal source portion;
a bottom surface of the insulating spacer contacts a top surface of the substrate source portion;
the substrate source portion extends under the insulating spacer to overlap in area, in a view along a direction perpendicular to a top surface of the substrate, a bottom of a source side select gate electrode in the alternating stack; and
the substrate source portion does not extend to a corner of the source side select gate electrode adjacent to the memory stack structure.

16. The three-dimensional memory device of claim 13, wherein a top surface of the epitaxial pedestal source portion is located above or below a source side select gate electrode in the alternating stack.

17. The three-dimensional memory device of claim 13, further comprising epitaxial channel portions contacting the substrate and underlying a respective memory stack structure and having a same semiconductor composition as the epitaxial pedestal source portion.

18. The three-dimensional memory device of claim 13, wherein each of the memory stack structures comprises, from inside to outside:
a semiconductor channel;
a tunneling dielectric layer laterally surrounding the semiconductor channel; and
charge storage regions laterally surrounding the tunneling dielectric layer.

19. The three-dimensional memory device of claim 13, wherein:
the three-dimensional memory device comprises a vertical NAND device formed in a device region;
the device region comprises:
a plurality of semiconductor channels, wherein at least one end portion of each of the plurality of semiconductor channels extends substantially perpendicular to a top surface of the substrate;
a plurality of charge storage regions, each charge storage region located adjacent to a respective one of the plurality of semiconductor channels; and
a plurality of control gate electrodes that are embodied as portions of the electrically conductive layers and have a respective strip shape extending substantially parallel to the top surface of the substrate;
the plurality of control gate electrodes comprise at least a first control gate electrode located in a first device level and a second control gate electrode located in a second device level; and
the electrically conductive layers in the stack extend from the device region to a contact region including a plurality of electrically conductive via connections; and
the substrate comprises a silicon substrate containing a driver circuit for the NAND device.

* * * * *